(12) United States Patent
Koo et al.

(10) Patent No.: US 9,620,570 B2
(45) Date of Patent: Apr. 11, 2017

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Wonhoe Koo, Gyeonggi-do (KR); BongChul Kim, Daegu (KR); KangJu Lee, Gyeonggi-do (KR); Sookang Kim, Gyeonggi-do (KR); Jihyang Jang, Gyeonggi-do (KR); Hyunsoo Lim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/753,262

(22) Filed: Jun. 29, 2015

(65) Prior Publication Data
US 2015/0380466 A1  Dec. 31, 2015

(30) Foreign Application Priority Data

Jun. 27, 2014 (KR) .................. 10-2014-0079457
Oct. 31, 2014 (KR) .................. 10-2014-0150652

(51) Int. Cl.
*H01L 51/52* (2006.01)
*H01L 27/32* (2006.01)

(52) U.S. Cl.
CPC ........ *H01L 27/322* (2013.01); *H01L 27/3258* (2013.01); *H01L 51/5275* (2013.01); *H01L 51/5281* (2013.01); *H01L 51/5209* (2013.01); *H01L 51/5225* (2013.01)

(58) Field of Classification Search
CPC ............... H01L 27/322; H01L 27/3258; H01L 51/5281; H01L 51/5275; H01L 51/5209; H01L 51/5225
See application file for complete search history.

(56) References Cited

U.S. PATENT DOCUMENTS

| | | | | |
|---|---|---|---|---|
| 9,318,726 B2* | 4/2016 | Choi | .................... | H01L 51/5275 |
| 2004/0253413 A1* | 12/2004 | Baba | ...................... | G02B 5/201 |
| | | | | 428/141 |
| 2008/0024402 A1* | 1/2008 | Nishikawa | .......... | H01L 51/5209 |
| | | | | 345/82 |
| 2009/0079336 A1* | 3/2009 | Yamada | ............... | H01L 51/5265 |
| | | | | 313/504 |

(Continued)

*Primary Examiner* — Donald Raleigh
(74) *Attorney, Agent, or Firm* — Morgan, Lewis & Bockius LLP

(57) ABSTRACT

Provided are an organic light emitting display device and a method for manufacturing the same. A color filter is disposed on a substrate. An overcoating layer is disposed on the color filter and includes a plurality of protrusions or a plurality of recesses. The plurality of protrusions and the plurality of recesses are disposed on the color filter to be overlapped with the color filter. A buffer layer for reducing step difference is disposed on the overcoating layer. The buffer layer has a higher refractive index than the overcoating layer and reduces a step difference caused by the plurality of protrusions and the plurality of recesses. An organic light emitting element including an anode, an organic light emitting layer, and a cathode is disposed on the buffer layer. Since the buffer layer has a higher refractive index than the overcoating layer, light extraction efficiency can be increased.

19 Claims, 16 Drawing Sheets

(56) References Cited

U.S. PATENT DOCUMENTS

| | | | |
|---|---|---|---|
| 2011/0038070 A1* | 2/2011 | Nakamata | G02B 5/201 359/891 |
| 2011/0074272 A1* | 3/2011 | Sakamoto | H01L 51/5265 313/113 |
| 2014/0175399 A1* | 6/2014 | Choi | H01L 27/322 257/40 |
| 2014/0353618 A1* | 12/2014 | Shim | H01L 27/3206 257/40 |
| 2015/0028739 A1* | 1/2015 | Kwon | H01L 51/5262 313/512 |
| 2015/0048333 A1* | 2/2015 | Choi | H01L 51/5275 257/40 |

* cited by examiner

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2014-0079457 filed on Jun. 27, 2014 and Korean Patent Application No. 10-2014-0150652 filed on Oct. 31, 2014 in the Korean Intellectual Property Office, both of which are hereby incorporated by reference.

BACKGROUND OF THE INVENTION

Field of the Invention

The present disclosure relates to an organic light emitting display device and a method for manufacturing the same, and more particularly, to an organic light emitting display device improved in light extraction efficiency and a method for manufacturing the same.

Description of the Related Art

An organic light emitting display device is a self-light emitting display that does not need a separate light source, like a liquid crystal display device which needs a backlight. Thus, the organic light emitting display device can be manufactured into a light-weight and thin form. Further, the organic light emitting display device is advantageous in terms of power consumption since it is driven with a low voltage. Also, the organic light emitting display device has excellent color reproduction ability, a high response speed, a wide viewing angle, and a high contrast ratio (CR). Therefore, the organic light emitting display device has been developed as a next-generation display device.

The light emitted from an organic light emitting layer of the organic light emitting display device passes through various elements of the organic light emitting display device and outputs from the organic light emitting display device. However, some of the light emitted from the organic light emitting layer cannot properly output from the organic light emitting display device and may be confined within the organic light emitting display device. Thus, the organic light emitting display device may have a problem with light extraction efficiency. In order to improve light extraction efficiency of the organic light emitting display device, a method of attaching a micro lens array (MLA) to an outer side of a substrate of the organic light emitting display device has been used.

SUMMARY

Accordingly, the present invention is directed to an organic light emitting display device and method for manufacturing the same that substantially obviates one or more of the problems due to limitations and disadvantages of the related art.

An object of the present invention is to provide an organic light emitting display device in a bottom-emission structure having improved light extraction efficiency when a micro lens array (MLA) is attached to an outer side of a substrate.

Another object of the present disclosure is to provide an organic light emitting display device improved in device efficiency by improving light extraction efficiency without deteriorating image or image quality and a method for manufacturing the same.

Another object of the present disclosure is to provide an organic light emitting display device further increased in life by improving light extraction efficiency and a method for manufacturing the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting display device comprises an overcoating layer having a plurality of protrusions or a plurality of recesses; and a buffer layer for reducing step differences. A color filter is disposed on a substrate. The overcoating layer is disposed on the color filter and includes a plurality of protrusions or a plurality of recesses. The plurality of protrusions and the plurality of recesses are disposed on the color filter so as to be overlapped with the color filter. The buffer layer is disposed on the overcoating layer. The buffer layer has a higher refractive index than the overcoating layer and reduces a step difference caused by the plurality of protrusions and the plurality of recesses. An organic light emitting element including an anode, an organic light emitting layer, and a cathode is disposed on the buffer layer. Since the buffer layer for reducing step differences having a higher refractive index than the overcoating layer is disposed between the overcoating layer and the anode, the light emitted from the organic light emitting layer is concentrate in a total reflection critical angle in both of an ITO mode and a substrate mode, enabling multiple reflection of the light. Thus, light extraction efficiency can be increased. Further, since the plurality of protrusions and the plurality of recesses of the overcoating layer are disposed so as to be overlapped with the color filter and disposed between the anode and the color filter, a blurring phenomenon and a ghost phenomenon can be removed and light interference caused by a circular polarizer can also be removed. Further, since the buffer layer for reducing the step difference (or other structural unevenness) is used, it is possible to suppress a short (or other electrical problem) between the anode and the cathode disposed on the overcoating layer.

In another aspect, an organic light emitting display device comprises: a plurality of edge-cut recesses and a filling layer. A color filter is disposed on a substrate. An overcoating layer is disposed on the color filter and includes the plurality of edge-cut recesses. The plurality of edge-cut recesses is disposed on the color filter so as to be overlapped with the color filter and exposes portions of the color filter. The filing layer is disposed on the overcoating layer. The filling layer has a higher refractive index than the overcoating layer and fills at least a part of the inside of the plurality of edge-cut recesses. Each of the plurality of edge-cut recesses has an inclined and curved side surface. An organic light emitting element including an anode, an organic light emitting layer, and a cathode is disposed on the filling layer. Since the filling layer disposed between the overcoating layer and the anode has a higher refractive index than the overcoating layer, it is possible to reduce lights emitted from the organic light emitting layer to be confined in an ITO mode and a substrate mode. Further, since the plurality of edge-cut recesses are disposed so as to expose the color filter, light extraction efficiency in the ITO mode can be improved. Furthermore, since the filling layer fills at least a part of the inside of the plurality of edge-cut recesses, the anode, the organic light emitting layer, and the cathode disposed on the filling layer can be disposed to have an embossed structure. Thus, current efficiency, driving voltage, and power efficiency of the organic light emitting display device can be improved.

In another aspect, a method for manufacturing an organic light emitting display device including an overcoating layer having a plurality of recesses and a buffer layer for reducing step differences. The method for manufacturing an organic light emitting display device comprises: forming a color filter on a substrate; forming an overcoating layer including a plurality of protrusions or a plurality of recesses disposed on the color filter to be overlapped with the color filter; forming a buffer layer for reducing step differences (or other structural unevenness), which has a higher refractive index than the overcoating layer and reduces a step difference caused by the plurality of protrusions or the plurality of recesses, on the overcoating layer; and forming an organic light emitting element by laminating an anode, an organic light emitting layer, and a cathode in sequence on the buffer layer. Since the buffer layer is formed on the overcoating layer, it is possible to prevent a short between the anode and the cathode formed on the overcoating layer.

In another aspect, an organic light emitting display device comprises an organic light emitting element having a shape resembling a morphology of a non-flat surface. A color filter is disposed on a substrate. An overcoating layer is disposed on the color filter and includes a plurality of protrusions or a plurality of recesses disposed to be overlapped with the color filter. The organic light emitting element is disposed on the overcoating layer and in direct contact with a non-flat surface of the overcoating layer. The organic light emitting element includes an anode, an organic light emitting layer on the anode, and a cathode on the organic light emitting layer. Each of the anode, the organic light emitting layer, and the cathode has a shape resembling a morphology of the non-flat surface of the overcoating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1B is an enlarged cross-sectional view of an area X of FIG. 1a;

FIG. 2B is an enlarged cross-sectional view of an area X of FIG. 2a;

DETAILED DESCRIPTION OF THE ILLUSTRATED EMBODIMENTS

Figure 1A:
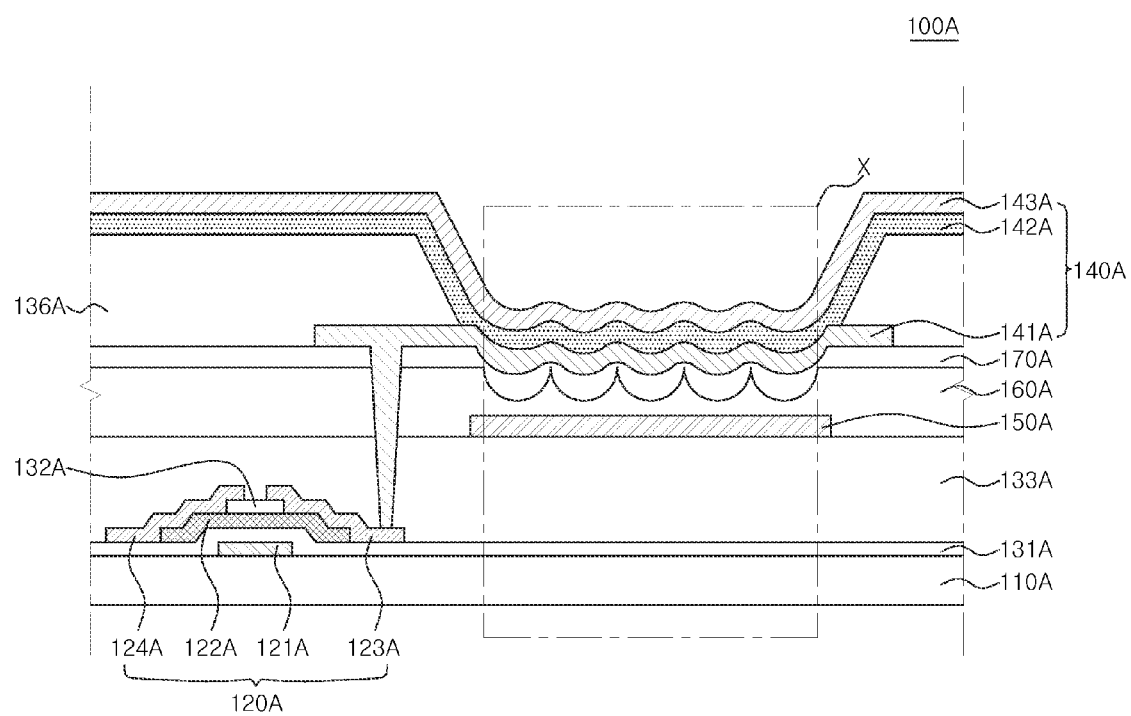
FIG. 1A is a cross-sectional view provided to describe an organic light emitting display device including an overcoating layer having a plurality of recesses and a buffer layer for reducing a step difference according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

A bottom-emission organic light emitting display device refers to an organic light emitting display device in which the light emitted from an organic light emitting element is released to a bottom side of the organic light emitting display device. It also means an organic light emitting display device in which the light emitted from an organic light emitting element is released in a direction toward a bottom surface of a substrate on which a thin film transistor for driving the organic light emitting display device is formed. The light emitted from an organic light emitting layer of a bottom-emission organic light emitting display device can be roughly classified into an ITO/organic mode (hereinafter, referred to as "ITO mode"), a substrate mode, and an air mode on the basis of a light propagation path. The air mode refers to the light extracted to the outside of the organic light emitting display device, among lights emitted from the organic light emitting layer; the substrate mode refers to the light confined within the organic light emitting display device due to total reflection or light absorption on the substrate, among lights emitted from the organic light emitting layer; and the ITO mode refers to the light confined within the organic light emitting display device due to total reflection or light absorption on an anode generally formed of ITO, among lights emitted from the organic light emitting layer. In the bottom-emission organic light emitting display device, lights confined within the organic light emitting display device as the ITO mode account for about 50% of lights emitted from the organic light emitting layer. Also, lights confined within the organic light emitting display device as the substrate mode account for about 30% of the lights emitted from the organic light emitting layer. Thus, the lights accounting for about 80% of the lights emitted from the organic light emitting layer are confined within the organic light emitting display device and only lights accounting for about 20% are extracted to the outside. Therefore, the improvement in light extraction efficiency of an organic light emitting display device is a very important line of research.

In order to solve the light extraction efficiency problem of the organic light emitting display device, there is a technique for improving light extraction efficiency by attaching a micro lens array (MLA) to an outer side of a substrate and extracting the light total-reflected by a difference in refractive index between the substrate and air to the outside.

However, if an MLA is attached to the outer side of the substrate, since the thickness of the substrate is generally much greater than a distance between the substrate and an anode, the light emitted from a specific pixel may be extracted to the outside of the substrate through an MLA positioned in a region other than for that specific pixel, which may cause a blurring phenomenon and/or a ghost phenomenon. Further, even when an MLA is attached to the entire outer surface of the substrate, the light emitted from a specific pixel may be extracted to the outside of the substrate through an MLA positioned in a region other than for that specific pixel, which may cause a blurring phenomenon and/or a ghost phenomenon. Furthermore, a circular polarizer is used in an organic light emitting display device to reduce external light reflection, and if an MLA is attached to an outer side of the organic light emitting display device, the light reflected from the MLA into the organic light emitting display device passes through the circular polarizer, and thus, light is undesirably attenuated, which causes a decrease in overall light extraction efficiency. In addition, if an MLA is attached to an outer side of the substrate, among the light confined within the organic light emitting display device, only the substrate mode light, but not the ITO mode light, can be extracted.

Accordingly, to solve the above-described problems which may occur when an MLA is attached to an outer side of a substrate, the inventors of the present disclosure provide a new structure capable of improving light extraction efficiency of a bottom-emission organic light emitting display device. Examples will be described herein.

Figure 1B:
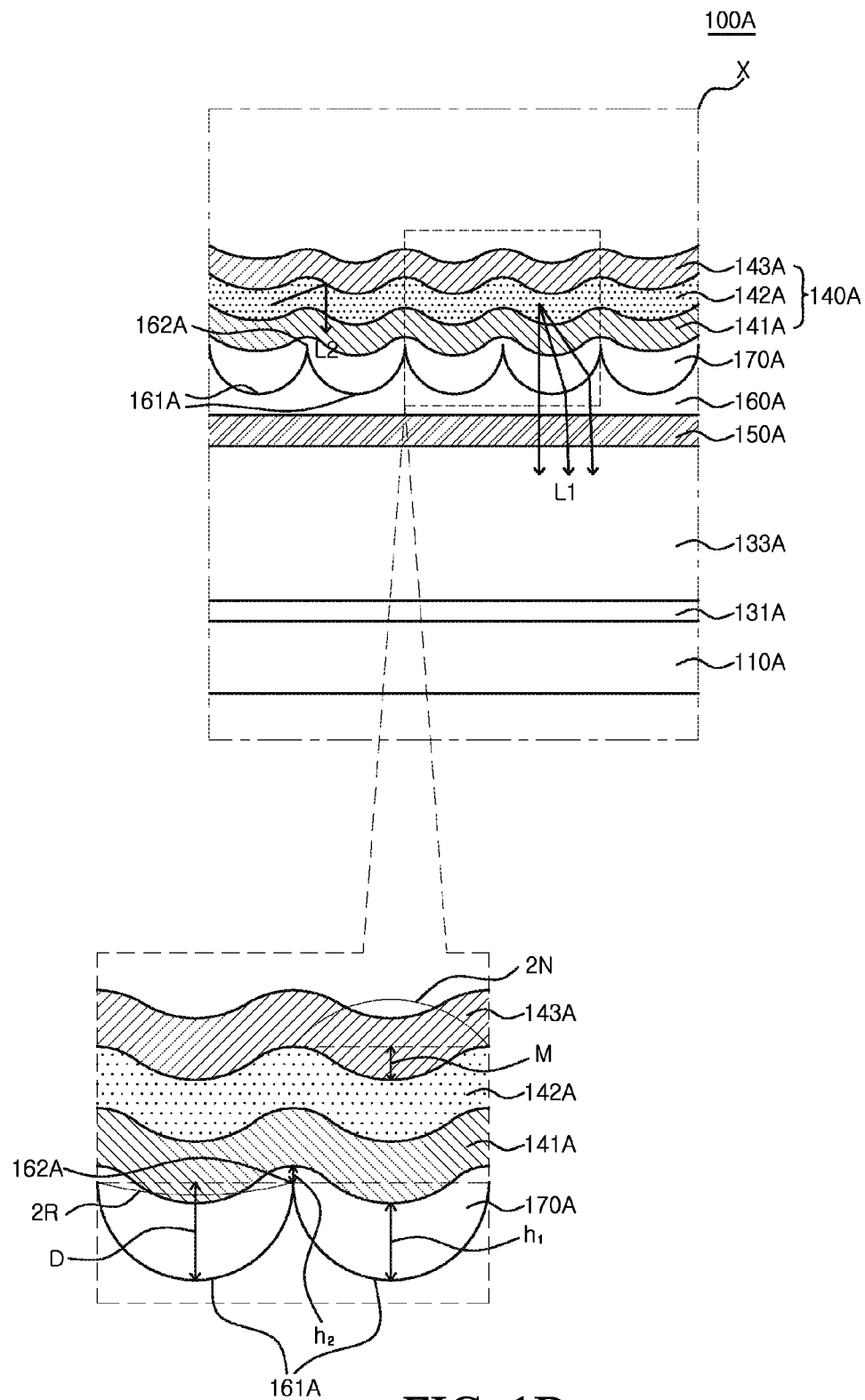

FIG. 1A is a cross-sectional view provided to describe an organic light emitting display device including an overcoating layer having a plurality of recesses and a buffer layer for reducing step differences according to an exemplary embodiment of the present disclosure. FIG. 1B is an enlarged cross-sectional view of an area X of FIG. 1A. With reference to FIG. 1A and FIG. 1B, an organic light emitting display device 100A includes a substrate 110A, a thin film transistor 120A, a color filter 150A, an overcoating layer 160A, a buffer layer for reducing a step difference 170A, and an organic light emitting element 140A. The organic light emitting display device 100A illustrated in FIG. 1*a* and FIG. 1*b* is of a bottom-emission type.

The thin film transistor 120A including a gate electrode 121A, an active layer 122A, a source electrode 123A, and a drain electrode 124A is formed on the substrate 110A formed of an insulation material. To be specific, the gate electrode 121A is formed on the substrate 110A, a gate insulation layer 131A for insulating the gate electrode 121A from the active layer 122A is formed on the gate electrode 121A and the substrate 110A, the active layer 122A is formed on the gate insulation layer 131A, an etch stopper 132A is formed on the active layer 122A, and the source electrode 123A and the drain electrode 124A are formed on the active layer 122A and the etch stopper 132A. The source electrode 123A and the drain electrode 124A are electrically connected with the active layer 122A as being in contact with the active layer 122A, and are formed on some areas of the etch stopper 132A. In the present specification, among various thin film transistors which can be included in the organic light emitting display device 100A, only a driving thin film transistor is illustrated for convenience in explanation. Further, in the present specification, the thin film transistor 120A is described as having an inverted staggered structure, but a thin film transistor having a coplanar structure may also be used.

A passivation layer 133A is formed on the thin film transistor 120A, and a color filter 150A is formed on the passivation layer 133A. The color filter 150A is configured to convert a color of light emitted from an organic light emitting layer 142A, and may be one of a red color filter, a green color filter, and a blue color filter. The color filter 150A may be formed of a material having a refractive index of about 1.5. If the color filter 150A is a red color filter, FIG. 1A illustrates a red pixel area of the organic light emitting display device 100A. If the color filter 150A is a green color filter, FIG. 1A illustrates a green pixel area of the organic light emitting display device 100A. And if the color filter 150A is a blue color filter, FIG. 1A illustrates a blue pixel area of the organic light emitting display device 100A.

The color filter 150A is formed on the passivation layer 133A at a position corresponding to a light emitting area. Herein, the light emitting area refers to an area where the organic light emitting layer 142 emits light using an anode 141A and a cathode 143A. The color filter 150A is formed at the position corresponding to the light emitting area, which means that the color filter 150A is disposed so as to suppress a blurring phenomenon and a ghost phenomenon caused by mixing of lights emitted from adjacent light emitting areas. For example, the color filter 150A is formed so as to be overlapped with a light emitting area, and specifically, has a size equal to or smaller than a size of the light emitting area. However, a position and a size of the color filter 150A can be determined by various factors including not only a size and a position of a light emitting area but also a distance between the color filter 150A and the anode 141A, a distance between the color filter 150A and a recess 161A or a protrusion 163E of the overcoating layer 160A, and a distance between light emitting areas.

The overcoating layer 160A is formed on the color filter 150A and the passivation layer 133A. The overcoating layer 160A is formed of an insulation material having a refractive index of about 1.5, and may be formed of one of, for example, but not limited thereto, acryl-based resin, epoxy-based resin, phenol resin, polyamide-based resin, polyimide-based resin, unsaturated polyester-based resin, polyphenylene-based resin, polyphenylenesulfide-based resin, benzocyclobutene, and photoresist. The overcoating layer 160A may be formed of any insulation material having a refractive index of about 1.5.

The overcoating layer 160A includes a plurality of recesses 161A formed so as to be overlapped with the color filter 150A and a first connection part 162 configured to connect the adjacent recesses 161A. Each of the plurality of recesses 161A has a hemispherical shape or a hemi-ellipsoidal shape. FIG. 1A and FIG. 1B are cross-sectional views of a portion where each of the plurality of recesses 161A has the maximum height of a hemispherical shape or a hemi-ellipsoidal shape, and illustrate each of the plurality of recesses 161A as having a hemispherical shape. Referring to FIG. 1B, a diameter 2R of each of the plurality of recesses 161A is about 1 μm to about 5 μm, and a height D is about 1 μm to about 4 μm. With reference to FIG. 1B, the first connection part 162A is the highest part between the adjacent recesses 161A. At a portion where the plurality of recesses 161A is not formed, the overcoating layer 160A serves as a planarization layer.

The buffer layer for reducing a step difference 170A is formed on the overcoating layer 160A. The buffer layer 170A is formed of a material having a higher refractive index than the overcoating layer 160A. The buffer layer 170A may have a refractive index of about 1.7 to about 2.0. To be specific, the buffer layer 170A may be a layer in which nanoparticles each having a size of several tens of nm and formed of titanium oxide ($TiO_2$) or zirconium oxide ($ZrO_2$) having a higher refractive index than a polymer binder are dispersed in the polymer binder. Or, nanoparticles may be dispersed in a layer in which nanoparticles formed of titanium oxide ($TiO_2$) or zirconium oxide ($ZrO_2$) having a higher refractive index than photoresist are dispersed in the photoresist.

The buffer layer for reducing a step difference 170A is configured to reduce such step difference caused by the plurality of recesses 161A of the overcoating layer 160A. That is, the buffer layer 170A is configured to partially fill recessed areas of the plurality of recesses 161A of the overcoating layer 160A in order to prevent the organic light emitting element 140A from being formed at a peaky point between the plurality of recesses 161A of the overcoating layer 160A and at a sharply inclined point between the plurality of recesses 161A. In other words, the buffer layer 170A can reduce the curvature of a surface on which the organic light emitting element 140A is formed.

The surface where the organic light emitting element 140A is disposed may be a top surface of the buffer layer for reducing the step difference 170A. The surface of the buffer layer 170A is a gently inclined non-flat surface. Thus, the organic light emitting element 140A is formed on the gently inclined non-flat surface.

Referring to FIG. 1B, in order to reduce a step difference caused by the plurality of recesses 161A, the buffer layer for reducing the step difference 170A on the recess 161A of the overcoating layer 160A is formed so as to have thickness $h_1$ greater than thickness $h_2$ of the buffer layer 170A on the first connection part 162A of the overcoating layer 160A.

Referring to FIG. 1A and FIG. 1B, the buffer layer for reducing the step difference 170A is formed so as to have a non-flat top surface. That is, since a top surface of the buffer layer 170A formed on the recess 161A of the overcoating layer 160A is on a different plane from a top surface of the buffer layer 170A formed on the first connection part 162A of the overcoating layer 160A, the top surface of the buffer layer 170A is formed to be non-flat. Therefore, the organic light emitting element 140A is formed on the gently inclined non-flat surface.

The organic light emitting element 140A including the anode 141A, the organic light emitting layer 142A, and the cathode 143A and the bank 136A are formed on the buffer layer for reducing the step difference 170A. To be specific, the anode 141A for supplying holes to the organic light emitting layer 142A is formed on the top surface of the buffer layer 170A. The organic light emitting layer 142A is formed on the anode 141A, and the cathode 143A for supplying electrons to the organic light emitting layer 142A is formed on the organic light emitting layer 142A. The anode 141A, the organic light emitting layer 142A, and the cathode 143A are formed along a non-flat top surface of the organic light emitting layer 142A and thus have non-flat top and bottom surfaces. For example, if the anode 141A, the organic light emitting layer 142A, and the cathode 143A are formed by deposition, each of the anode 141A, the organic light emitting layer 142A, and the cathode 143A is formed to have a shape resembling a morphology of a surface on which each of the anode 141A, the organic light emitting layer 142A, and the cathode 143A is formed. The anode 141A is formed of a transparent conductive oxide, such as ITO, having a high work function, and the cathode 143A is formed of a metallic material having a low work function. In the present specification, since the organic light emitting display device 100A is of a bottom-emission type, the metallic material constituting the cathode 143A needs to have an excellent reflectivity.

As the image resolution of an organic light emitting display device increases, the size of each pixel of the organic light emitting display device decreases and thus the total number of pixels increases. Therefore, in a high-resolution organic light emitting display device, there is an increase in power required to emit light having the same luminance as a relatively low-resolution organic light emitting display device, and there may be a problem with the life of an organic light emitting element. Accordingly, in the organic light emitting display device 100A according to an exemplary embodiment of the present disclosure, the organic light emitting layer 142A is formed to have the non-flat top and bottom surfaces. Thus, the organic light emitting layer 142A has an increased light emitting area as compared with the planarized organic light emitting layer 142. Therefore, a voltage and a current required to emit light having the same luminance may be decreased and power may also be decreased, and the life of the organic light emitting element 140A may be increased.

Among the cathodes 143A of the organic light emitting element 140A, the cathode 143A formed on the recess 161A of the overcoating layer 160A has an aspect ratio of about 0.5 or more to about 0.7 or less. Referring to FIG. 1B, the aspect ratio of the cathode 143A means a value obtained by dividing a height M of the cathode 143A formed on the recess 161A by a radius N of the cathode 143A.

The organic light emitting layer 142A is formed into a so-called tandem white structure in which a plurality of organic light emitting layers are laminated to emit white light. The organic light emitting layer 142A includes a first organic light emitting layer configured to emit blue light and a second organic light emitting layer formed on the first organic light emitting layer and configured to emit light of a particular color, which results in white light when mixed with the blue light. The second organic light emitting layer may be an organic light emitting layer configured to emit, for example, yellow-green light. It can be understood that other color combinations for the light emitting layers can be implemented to obtain the desired white light output.

Generally, in order to increase light extraction efficiency of an organic light emitting display device, a micro-cavity effect is applied. The micro-cavity effect refers to a mechanism for increasing light extraction efficiency using light reflecting property and an optical constructive interference of an electrode. The micro-cavity effect is realized by satisfying a specific optical condition in which a wavelength corresponding to a specific color is reflected and constructed between a reflective electrode and a semi-transmissive electrode. A wavelength to be constructed can be selected by controlling a distance between the reflective electrode and the semi-transmissive electrode, i.e., thickness of an organic light emitting layer. Theoretically, when an integer multiple of a wavelength corresponding to a specific color becomes an even multiple of the thickness of an organic light emitting layer, constructive interference of the wavelengths corresponding to a specific color occurs. Herein, a constructive interference condition can be expressed by the following equation.

$$2nd=m\lambda$$

(n, m=integer, m=order of wavelength, d=thickness of organic light emitting layer, $\lambda$=reference wavelength at which constructive interference occurs)

In order to apply the micro-cavity effect to an organic light emitting element, from a semi-transmissive electrode and a reflective electrode, an optimum point for an area where light corresponding to a particular wavelength to be constructed is emitted is calculated. Then, the total thickness of an organic light emitting layer is calculated in consideration of the constructive interference condition. If the organic light emitting element is designed by applying the calculated results, it is possible to improve light extraction efficiency at a wavelength corresponding to a specific color.

The optical condition for realizing the micro-cavity effect limits the thickness of the organic light emitting layer. For example, if the organic light emitting layer is formed to have a structure in which two organic light emitting layers are laminated to emit white light, the organic light emitting layer needs to have a thickness of about 350 nm or more to about 400 nm or less in order to increase light extraction efficiency by applying the micro-cavity effect. That is, if the organic light emitting layer is formed to have a structure in which two organic light emitting layers are laminated to emit white light, the organic light emitting layer needs to have a thickness of 350 nm or more in order for the organic light emitting element to satisfy the optical condition for realizing the micro-cavity effect. Further, as the number of the laminated organic light emitting layers increases, thickness of the organic light emitting layer necessarily increases according to the optical condition for realizing the micro-cavity effect. As the thickness of the organic light emitting layer increases, the cost and time for manufacturing the organic light emitting element increases and a driving voltage and power consumption for driving the organic light emitting display device also increase.

As a result, in the case of applying the micro-cavity effect in order to increase light extraction efficiency, there is an increase in driving voltage and power consumption caused by an increase in the thickness of the organic light emitting layer. Also, there is a decrease in power efficiency.

However, the organic light emitting display device 100A according to an exemplary embodiment of the present disclosure increases light extraction efficiency by applying the overcoating layer 160A and the buffer layer for reducing the step difference 170A instead of applying the micro-cavity effect. Therefore, the organic light emitting display device 100A according to an exemplary embodiment of the present disclosure does not necessarily optimize the thickness of the organic light emitting layer 142A for the optical condition for realizing the micro-cavity effect in order to increase light extraction efficiency. Thus, the thickness of the organic light emitting layer 142A can be significantly reduced. That is, in the organic light emitting element 140A of the organic light emitting display device 100A according to an exemplary embodiment of the present disclosure, the organic light emitting layer 142A may have a small thickness of 350 nm or less.

Light emitted from the first organic light emitting layer positioned at a lower part of the organic light emitting layer 142A has a higher ratio of being confined in an ITO mode than lights emitted from the second light emitting layer positioned at an upper part. In the organic light emitting display device 100A according to an exemplary embodiment of the present disclosure, the organic light emitting layer 142A is formed into a structure in which a plurality of organic light emitting layers is laminated to emit white light, and among the plurality of organic light emitting layers, the first organic light emitting layer positioned at a lower part is configured to emit blue light. Thus, it is possible to reduce confinement of ITO mode blue lights emitted from the first organic light emitting layer. Therefore, the overall luminous efficiency of the organic light emitting display device 100A can be improved. Further, luminous efficiency of blue light, which is a problem in a general organic light emitting display device, can also be improved.

If the plurality of recesses 161A is formed in the overcoating layer 160A by a process such as photolithography, there is a portion, which is peaky and sharply changed in morphology, like the first connection part 162A illustrated in FIG. 1B. However, since the organic light emitting layer 142A of the organic light emitting element 140A is formed by a thermal deposition method by which a step coverage of the organic light emitting layer 142A deteriorates and the organic light emitting layer 142A is formed to have very small thickness of several hundreds of nm, there may be an area where the organic light emitting layer is not formed on the anode. Thus, the possibility of a short between the anode and the cathode is high. In the organic light emitting display device 100A according to an exemplary embodiment of the present disclosure, the buffer layer for reducing step difference 170A configured to reduce a step (or other structural unevenness) caused by the plurality of recesses 161A of the overcoating layer 160A is adopted. Thus, the possibility of a short (or other electrical problem) between the anode 141A and the cathode 143A caused by a shape of the overcoating layer 160A can be greatly reduced.

In the organic light emitting display device 100A according to an exemplary embodiment of the present disclosure, the buffer layer for reducing step difference 170A having a higher refractive index of about 1.7 to about 2.0 than the overcoating layer 160A is formed on the overcoating layer 160A. Generally, ITO used as the anode 141A has a refractive index of about 1.7 and the overcoating layer 160A has a refractive index of about 1.5. Thus, light emitted from the organic light emitting layer 142A is not total-reflected at an interface between the anode 141A and the buffer layer 170A and may be total-reflected at an interface between the buffer layer 170A and the overcoating layer 160A. However, since the overcoating layer 160A of the organic light emitting display device 100A according to an exemplary embodiment of the present disclosure includes the plurality of recesses 161A and the buffer layer 170A is formed on the overcoating layer 160A including the plurality of recesses 161A, the overcoating layer 160A and the buffer layer 170A may be formed into a micro lens array (MLA). Therefore, light emitted from the organic light emitting layer 142A is highly likely to have a lower incident angle at the interface between the buffer layer 170A and the overcoating layer 160A than a total reflection critical angle. Thus, it is possible to reduce an amount of ITO mode light to be confined within the organic light emitting display device 100A. Further, light emitted from the organic light emitting layer 142A passes through the interface between the buffer layer 170A and the overcoating layer 160A and travels at an angle nearly vertical to a bottom surface of the substrate 110A (refer to L1 in FIG. 1B). Since the light passing through the interface between the buffer layer 170A and the overcoating layer 160A is highly likely to have a lower angle in a substrate mode than the total reflection critical angle, it is also possible to reduce an amount of substrate mode light to be confined within the organic light emitting display device 100A. Furthermore, by enabling multiple reflection of light emitted from the interface between the buffer layer 170A and the overcoating layer 160A, the light can be reused so as to meet the MLA including the overcoating layer 160A and the buffer layer 170A more times. Therefore, it is possible to reduce an amount of ITO mode and substrate mode light to be confined within the organic light emitting display device 100A. Thus, light extraction efficiency can be increased and the life of the organic light emitting element 140A can also be increased.

As described above, in the organic light emitting display device 100A according to an exemplary embodiment of the present disclosure, the overcoating layer 160A including the plurality of recesses 161A and the buffer layer for reducing step difference 170A are formed into an MLA and the MLA is formed between the color filter 150A and the anode 141A. Therefore, in the organic light emitting display device 100A according to an exemplary embodiment of the present disclosure as compared with a structure in which an MLA is disposed at an outer side of the substrate 110A, a blurring phenomenon or a ghost phenomenon can be removed. Further, it is possible to prevent light reflected from the interface between the overcoating layer 160A and the buffer layer 170A into the organic light emitting display device 100A from being attenuated while passing through a circular polarizer. Further, in the organic light emitting display device 100A according to an exemplary embodiment of the present disclosure, since the plurality of recesses 1601A of the overcoating layer 160A are formed so as to be overlapped with the color filter 150A, a blurring phenomenon or a ghost phenomenon can be removed.

Since the organic light emitting display device 100A according to an exemplary embodiment of the present disclosure is of a bottom-emission type, the cathode 143A is formed of a metallic material having an excellent reflecting property and the light emitted from the organic light emitting layer 142A is reflected from the cathode 143A and travels toward the substrate 110A, and the cathode 143A of the organic light emitting display device 100A has non-flat top and bottom surfaces. Particularly, the cathode 143A formed on the recess 161A of the overcoating layer 160A has non-flat top and bottom surfaces so as to have an aspect ratio of about 0.5 or more to about 0.7 or less.

Therefore, when the light emitted from the organic light emitting layer 142A is reflected from the cathode 143A and then travels toward the anode 141A, a traveling angle of the light is highly likely to be lower than the total reflection critical angle at the interface between the overcoating layer 160A and the buffer layer for reducing step difference 170A according to modification of a surface shape of the cathode 143A (refer to L2 in FIG. 1B). Therefore, since it is possible to reduce an amount of light to be confined within the organic light emitting display device 100A, a voltage and a current required to emit light having the same luminance may be decreased and power may also be decreased, and the life of the organic light emitting element 140A may be increased.

FIG. 1A and FIG. 1B illustrate only a cross-sectional view and an enlarged cross-sectional view of the organic light emitting display device 100A. However, the plurality of recesses 161A of the overcoating layer 160A in the organic light emitting display device 100A may be disposed on the plane of the color filter 150A so as to have a hexagonal structure.

Although FIG. 1A and FIG. 1B illustrate that the passivation layer 133A planarizes an upper portion of the thin film transistor 120A, the passivation layer 133A may be formed along surface shapes of the elements disposed under the passivation layer 133A without planarizing the upper portion of the thin film transistor 120A. Further, although FIG. 1A and FIG. 1B illustrate that the passivation layer 133A is included in the organic light emitting display device 100A, the overcoating layer 160A may be directly formed on the thin film transistor 120A without using the passivation layer 133A.

Although FIG. 1A and FIG. 1B illustrate that the color filter 150A is formed on the passivation layer 133A, it is not limited thereto. The color filter 150A may be formed at a certain position between the overcoating layer 160A and the buffer layer for reducing step difference 170A formed into the MLA and the substrate 110A.

Although FIG. 1A and FIG. 1B illustrate that the color filter 150A is disposed on the passivation layer 133A, if the organic light emitting display device 100A includes a white pixel area, the color filter 150A may not be disposed in the white pixel area. That is, in the white pixel area, white light emitted from the organic light emitting element 140A can be emitted as it is. Thus, the color filter 150A is not needed in the white pixel area. However, in the white pixel area in which the color filter 150A is not provided, the external light incident from the outside of the organic light emitting display device 100A is reflected and emitted within the organic light emitting display device 100A unlike a red pixel area, a green pixel area, and a blue pixel area each including the color filter 150A. Thus, it is more urgent to improve visibility in the white pixel area. Accordingly, in some exemplary embodiments, even in the white pixel area of the organic light emitting display device 100A in which the color filter 150A is not provided, the overcoating layer 160A and the buffer layer for reducing step difference 170A may be formed into an MLA and thus suppress external light reflection. To be specific, some of external lights incident into the white pixel area of the organic light emitting display device 100A may meet the MLA including the overcoating layer 160A and the buffer layer 170A. The lights may meet the MLA before reaching the anode 141A having a light transmitting property and may be refracted so as to travel in almost parallel to a surface of the organic light emitting display device 100A. Such incident external lights are refracted by the MLA and thus cannot reach the anode 141A and may be confined within a certain layer of the organic light emitting display device 100A. That is, external lights incident into the organic light emitting display device 100A cannot be emitted from the organic light emitting display device 100A.

In the method for manufacturing the organic light emitting display device 100A, the overcoating layer 160A may be manufactured together with the color filter 150A, and it may be difficult to pattern the overcoating layer 160A in order for the overcoating layer 160A to include the plurality of recesses 161A depending on a manufacturing process condition. In this case, the plurality of recesses 161A is not directly formed in the overcoating layer 160A, but photoresist is separately coated and patterned on the overcoating layer 160A, so that the photoresist includes a plurality of recesses and the buffer layer for reducing step difference 170A and an MLA may be formed.

Figure 1C:
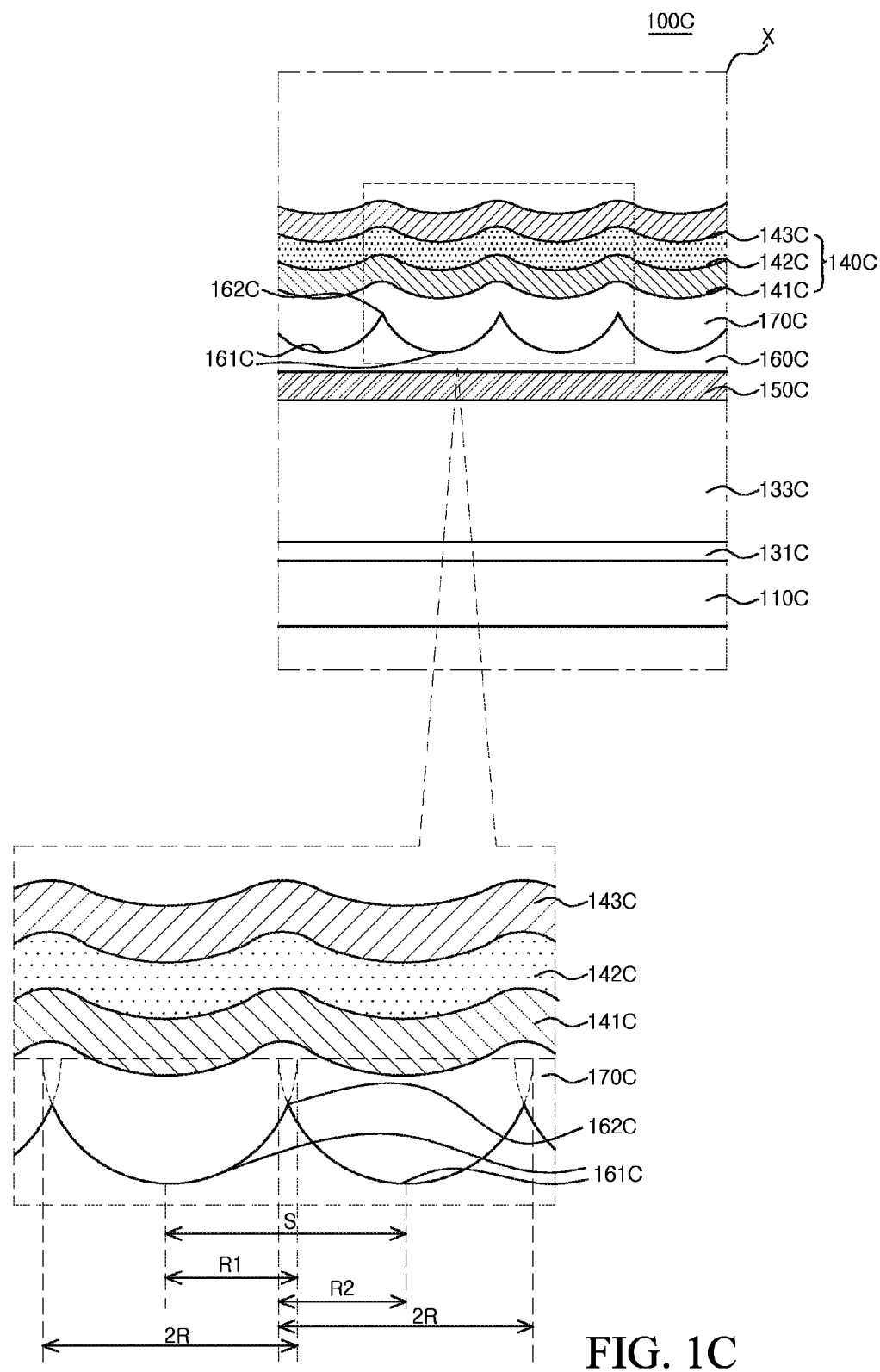
FIG. 1C is an enlarged cross-sectional view provided to describe shapes different from those of FIG. 1B of the overcoating layer and the buffer layer for reducing a step difference in the organic light emitting display device according to an exemplary embodiment of the present disclosure.

FIG. 1C is an enlarged cross-sectional view provided to describe shapes different from those of FIG. 1B of the overcoating layer and the buffer layer for reducing step differences in the organic light emitting display device according to an exemplary embodiment of the present disclosure. An organic light emitting display device 100C illustrated in FIG. 1C is substantially the same as the organic light emitting display device 100A illustrated in FIG. 1A and FIG. 1B except shapes of an overcoating layer 160C and a buffer layer for reducing step difference 170A. Therefore, redundant description thereof will be omitted.

Referring to FIG. 1C, each of a plurality of recesses 161C of the overcoating layer 160C is overlapped with an adjacent recess 161C. In FIG. 1C, an overlapped and removed portion of the recesses 161C is indicated by a dotted line. A diameter 2R of each of the plurality of recesses 161C of the overcoating layer 160C is equal to or greater than a distance S between the centers of the recesses 161C adjacent to each other. That is, assuming that a radius of one recess 161C is R1, a radius of its adjacent recess 161C is R2, and a distance between the centers of the recesses 161C is S, the sum of R1 and R2 is equal to or greater than S. If each of the plurality of recesses 161 has a hemispherical shape, a diameter of the hemispherical shape is equal to or greater than a distance S between the centers of hemispherical shapes adjacent to each other. If each of the plurality of recesses 161 has a hemi-ellipsoidal shape, a diameter of the hemi-ellipsoidal shape is equal to or greater than a distance S between the centers of hemi-ellipsoidal shapes adjacent to each other. Herein, the diameter 2R of the recess 161C means a diameter in a state where the recess 161C is not removed as not being overlapped with its adjacent recess 161C, and the center of the recess 161C means the lowest point of the recess 161C having a hemispherical shape or a hemi-ellipsoidal shape.

If the plurality of recesses 161C is overlapped with each other, a pitch between recesses 161C adjacent to each other is small as compared with a case where the plurality of recesses 161C is not overlapped with each other. Further, as a pitch between the plurality of recesses 161C decreases, a size of a grating vector increases. Therefore, in the organic light emitting display device 100C according to an exemplary embodiment of the present disclosure, the adjacent recesses 161C are formed so as to be overlapped with each other, which causes an increase in size of a grating vector. Thus, it is possible to further increase light extraction efficiency.

Figure 1D:
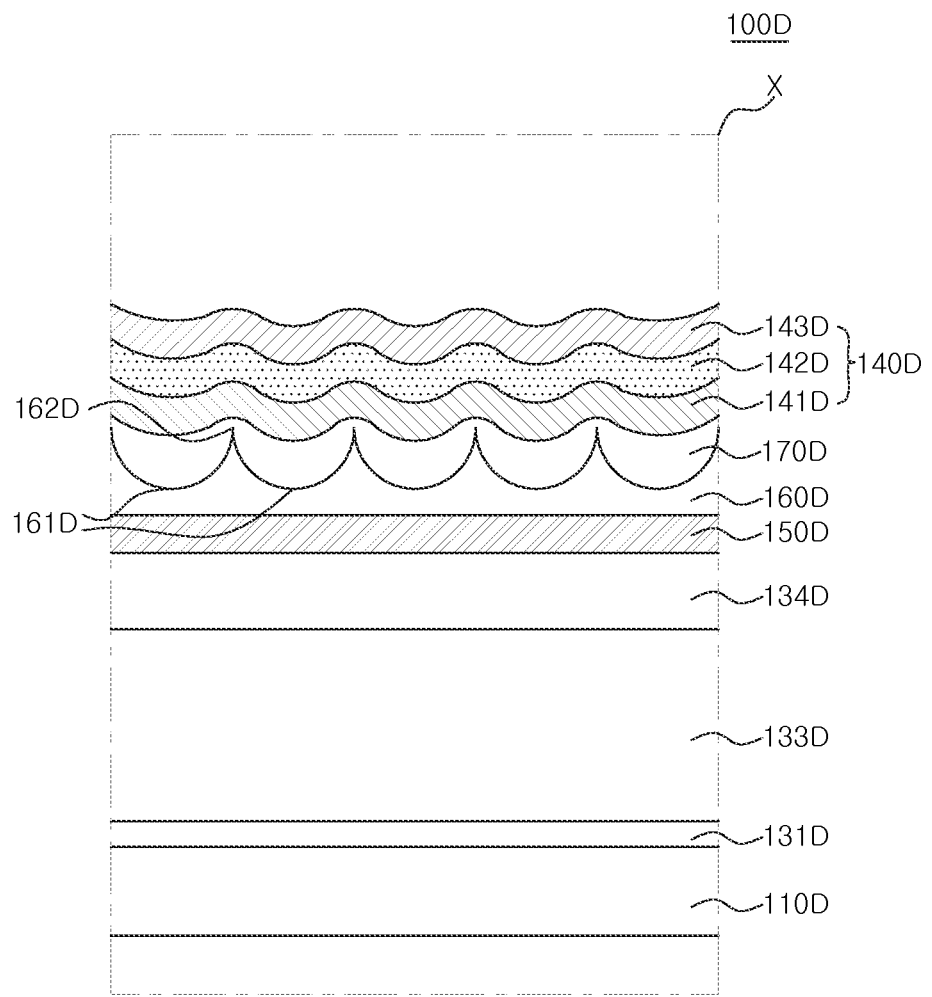
FIG. 1D is an enlarged cross-sectional view provided to describe an additional insulation layer of the organic light emitting display device according to an exemplary embodiment of the present disclosure.

FIG. 1D is an enlarged cross-sectional view provided to describe an additional insulation layer of the organic light emitting display device according to an exemplary embodiment of the present disclosure. An organic light emitting display device 100D illustrated in FIG. 1D is substantially the same as the organic light emitting display device 100A illustrated in FIG. 1A and FIG. 1B except that an insulation layer 134D is further included. Therefore, redundant description thereof will be omitted.

The insulation layer 134D is further formed between a passivation layer 133D and a color filter 150D. The insulation layer 134D has a lower refractive index than an overcoating layer 160D and the color filter 150D. The insulation layer 134D may be formed of a fluorinated polymer, such as fluorinated lithium (LiF), having a refractive index of about 1.3 to about 1.4, but is not limited thereto. The insulation layer 134D may be formed of any material having a refractive index of about 1.3 to about 1.4.

Since the color filter 150D has a refractive index of about 1.5 and the insulation layer 134D formed under the color filter 150D has a refractive index of about 1.3 to about 1.4, among lights emitted from an organic light emitting layer 142D, the light incident into an interface between the color filter 150D and the insulation layer 134D at an incident angle higher than the total reflection critical angle is total-reflected at the interface between the color filter 150D and the insulation layer 134D. In the organic light emitting display device 100D according to an exemplary embodiment of the present disclosure, if the insulation layer 134D is not used, among lights emitted from the organic light emitting layer 142D and passing through the color filter 150D, the light having an incident angle higher than the total reflection critical angle and total-reflected at an interface between a substrate 110D and air is total-reflected at the interface between the color filter 150D and the insulation layer 134D. Then, it travels toward an MLA including a buffer layer for reducing step difference 170D and the overcoating layer 160D. When the light passes through the MLA many times, it can be converted into a light traveling at an incident angle lower than the total reflection critical angle at the interface between the substrate 110D and air. Therefore, in the organic light emitting display device 100D according to an exemplary embodiment of the present disclosure, by using the insulation layer 134D having a lower refractive index than the overcoating layer 160D and the color filter 150D, it is possible to increase light extraction efficiency of substrate mode lights confined within the organic light emitting display device 100D.

Although FIG. 1D illustrates that the insulation layer 134D is formed on the passivation layer 133D, the insulation layer 134D may be formed at a different position between the substrate 110D and the color filter 150D.

Although FIG. 1D illustrates that the insulation layer 134D is formed between the color filter 150D and the passivation layer 133D, an air gap may be formed instead of the insulation layer 134D. That is, a space filled with air may be formed between the color filter 150D and the passivation layer 133D. Since air has a lower refractive index than the color filter 150D, the air gap may have the same effect as the above-described insulation layer 134D. Further, the air gap may be formed at a different position between the substrate 110D and the color filter 150D in the same manner as the insulation layer 134D.

Figure 1E:
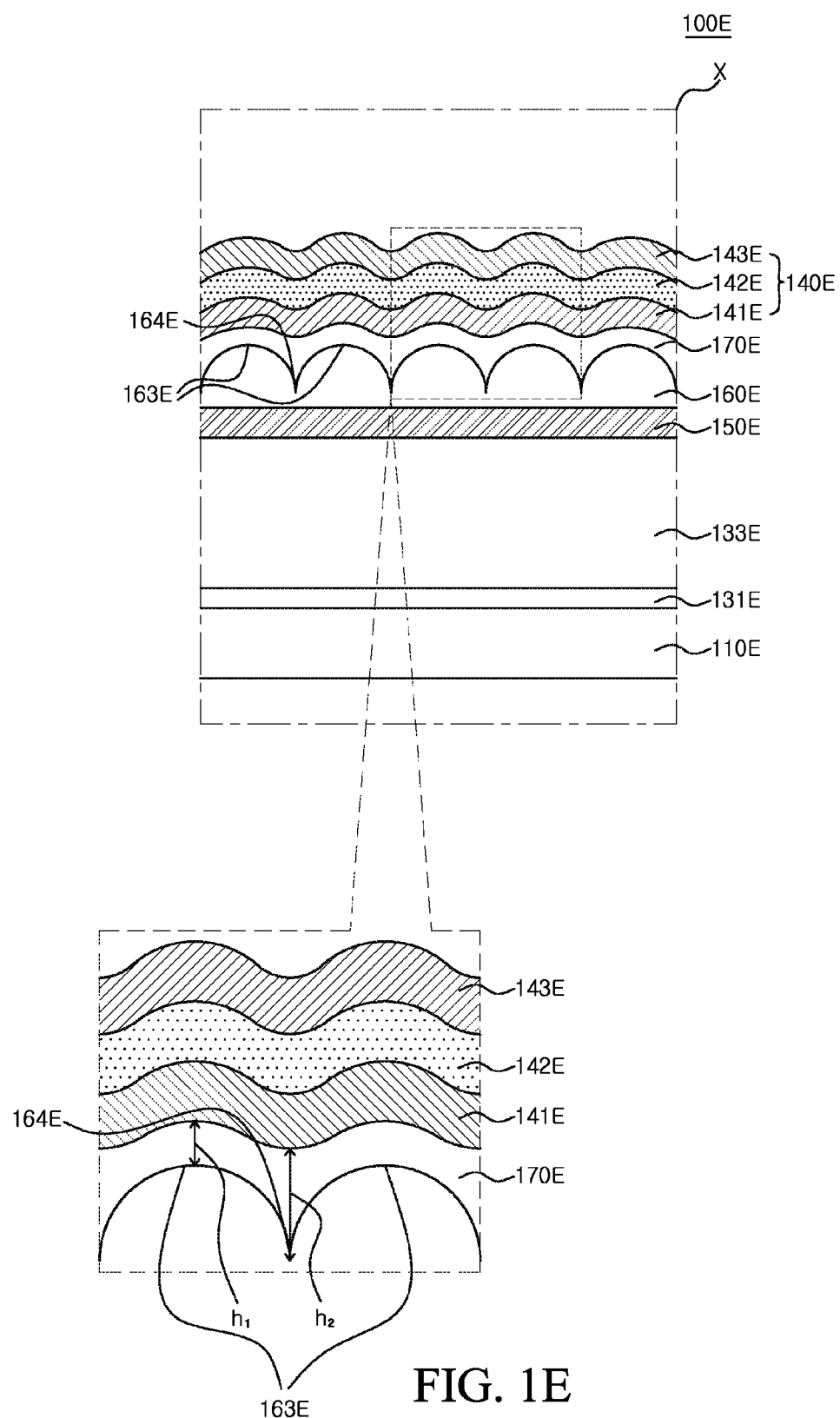
FIG. 1E is a cross-sectional view provided to describe the organic light emitting display device including an overcoating layer having a plurality of protrusions and a buffer layer for reducing a step difference according to an exemplary embodiment of the present disclosure.

FIG. 1E is a cross-sectional view provided to describe the organic light emitting display device including an overcoating layer having a plurality of protrusions and a buffer layer for reducing step differences according to an exemplary embodiment of the present disclosure. An organic light emitting display device 100E illustrated in FIG. 1E is substantially the same as the organic light emitting display device 100A illustrated in FIG. 1A and FIG. 1B except that an overcoating layer 160E includes a plurality of protrusions 163E and a buffer layer for reducing step difference 170E has a different shape. Therefore, redundant description thereof will be omitted.

The overcoating layer 160E includes the plurality of protrusions 163E formed so as to be overlapped with a color filter 150E and a second connection part 164E configured to connect the adjacent protrusions 163E. Each of the plurality of protrusions 163E has a hemispherical shape or a hemi-ellipsoidal shape. FIG. 1E is a cross-sectional view illustrating a portion having the highest height in a hemispherical shape or a hemi-ellipsoidal shape of each of the plurality of protrusions 163E, and illustrates each of the plurality of protrusions 163E as having a hemispherical shape. A diameter and a height of each of the plurality of protrusions 163E may be equal to the diameter 2R and the height D of each of the plurality of recesses 161A illustrated in FIG. 1A and FIG. 1B.

The buffer layer for reducing step difference 170E is formed on the overcoating layer 160E. The buffer layer 170E is configured to reduce a step difference caused by the plurality of protrusions 163E of the overcoating layer 160E. Referring to FIG. 1E, in order to reduce a step difference caused by the plurality of protrusions 163E, the buffer layer 170E on the protrusion 163E of the overcoating layer 160E is formed so as to have a thickness $h_1$ smaller than a thickness $h_2$ of the buffer layer 170E on the second connection part 164E of the overcoating layer 160E.

Referring to FIG. 1E, the buffer layer for reducing step difference 170E is formed so as to have a non-flat top surface. That is, since a top surface of the buffer layer 170E formed on the protrusion 163E of the overcoating layer 160E is on a different plane from a top surface of the buffer layer 170E formed on the second connection part 164E of the overcoating layer 160E, the top surface of the buffer layer 170E is formed to be non-flat. Therefore, the organic light emitting element 140A is formed on the gently inclined non-flat surface.

In the organic light emitting display device 100E according to an exemplary embodiment of the present disclosure, the overcoating layer 160E includes the plurality of protrusions 163E and the buffer layer for reducing step difference 170E reduces a step difference caused by the plurality of protrusions 163E of the overcoating layer 160E. The overcoating layer 160E and the buffer layer 170E are formed into an MLA, and the MLA including the overcoating layer 160E and the buffer layer 170E may have the same function as the MLA including the overcoating layer 160A and the buffer layer 170A described above with reference to FIG. 1A and FIG. 1B. Further, the buffer layer 170E may have the same function as the buffer layer 170A described above with reference to FIG. 1A and FIG. 1B.

In some exemplary embodiments, each of the plurality of protrusions 163E of the overcoating layer 160E may be overlapped with its adjacent protrusion 163E. In this case, a diameter of each of the plurality of protrusions 163E of the overcoating layer 160E is equal to or greater than a distance between the centers of the protrusions 163E adjacent to each other. That is, assuming that a radius of one protrusion 163E is R1, a radius of its adjacent protrusion 163E is R2, and a distance between the centers of the protrusions 163E is S, the sum of R1 and R2 is equal to or greater than S. Herein, the diameter, the radius, and the center of the protrusion 163E can be defined as the same effect as the diameter 2R, the radiuses R1 and R2, and the center of the recess 161A illustrated in FIG. 1A and FIG. 1B.

Figure 2A:
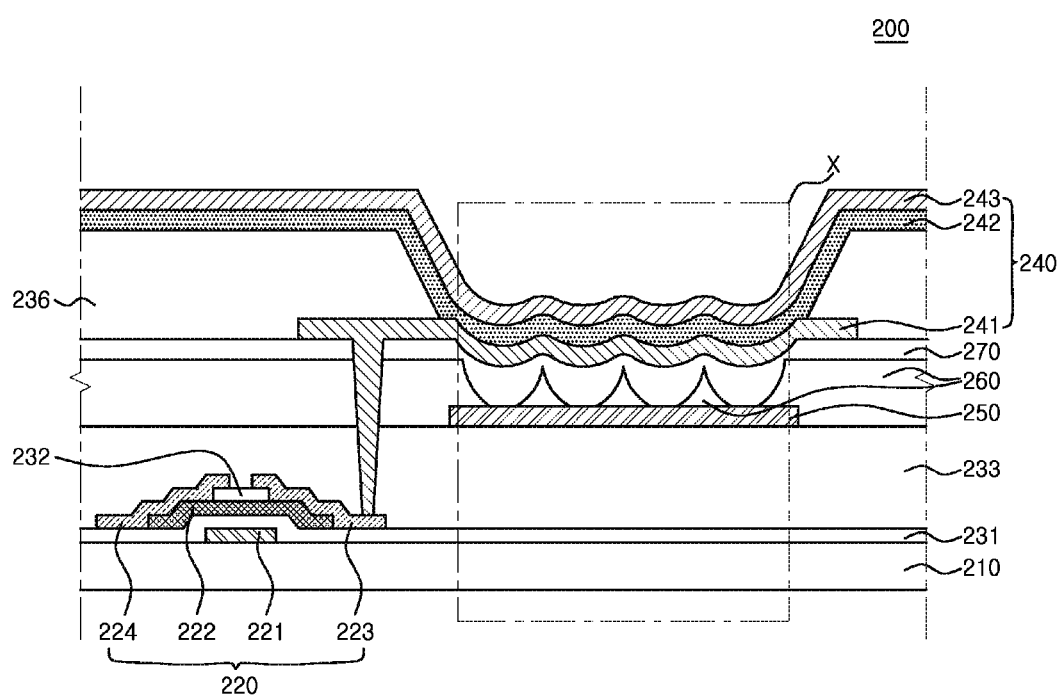
FIG. 2A is a cross-sectional view provided to describe an organic light emitting display device including a plurality of edge-cut recesses and a filling layer according to an exemplary embodiment of the present disclosure.
Figure 2B:
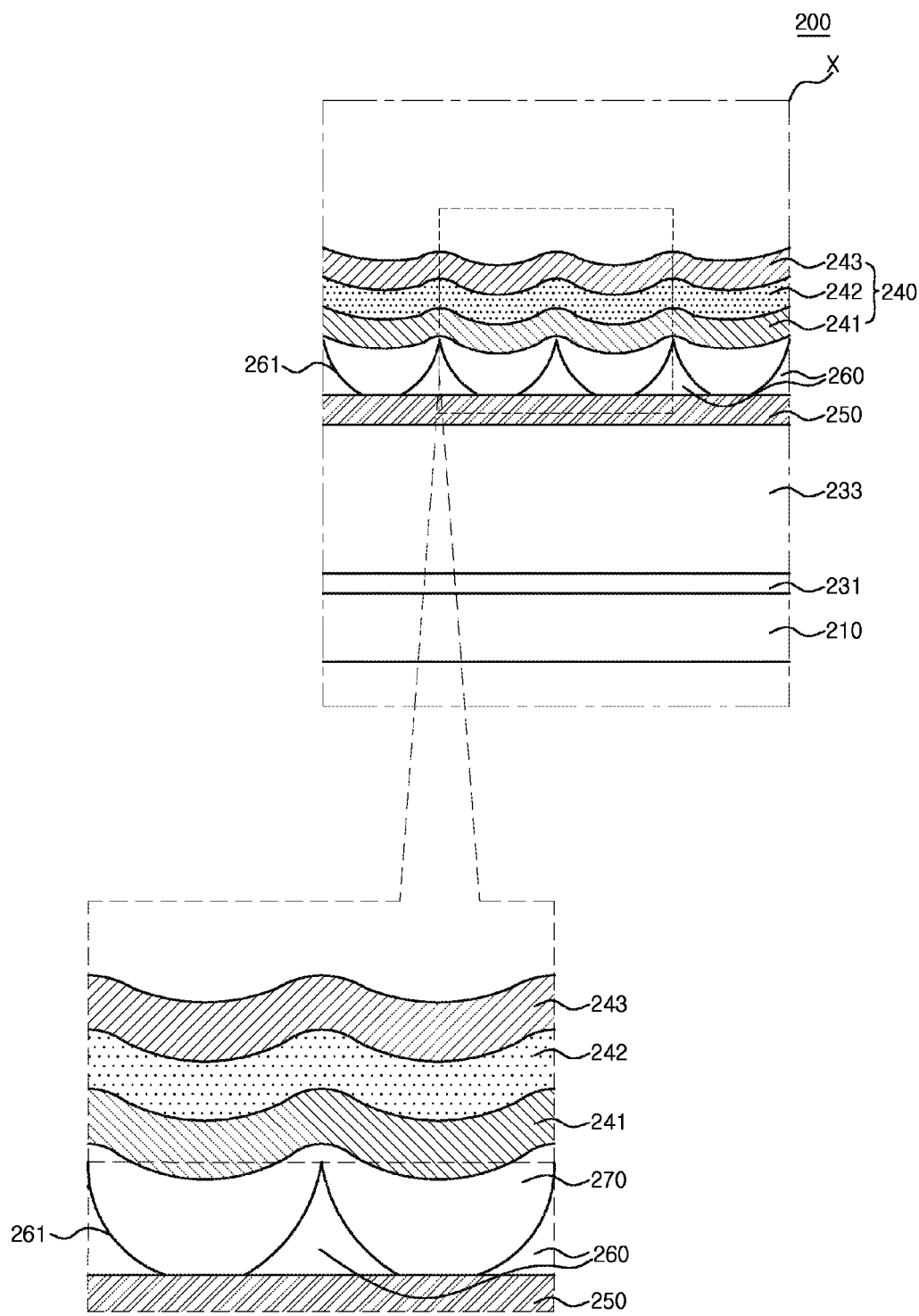

FIG. 2A is a cross-sectional view provided to describe an organic light emitting display device including a plurality of edge-cut recesses and a filling layer according to an exemplary embodiment of the present disclosure. FIG. 2B is an enlarged cross-sectional view of an area X of FIG. 2A. Referring to FIG. 2A and FIG. 2B, an organic light emitting display device 200 includes a substrate 210, a thin film transistor 220, a color filter 250, an overcoating layer 260, a filling layer 270, and an organic light emitting element 240. The organic light emitting display device 200 illustrated in FIG. 2A and FIG. 2B is substantially the same as the organic light emitting display device 100A illustrated in FIG. 1A and FIG. 1B except that the overcoating layer 260 has a different shape and the filling layer 270 is employed. Therefore, redundant description thereof will be omitted.

The overcoating layer 260 is formed on the color filter 250 and a passivation layer 233. The overcoating layer 260 includes a plurality of edge-cut recesses 261 formed so as to be overlapped with the color filter 250. Since each of the plurality of edge-cut recesses 261 has an edge-cut hemispherical shape or hemi-ellipsoidal shape, each of the plurality of edge-cut recesses 261 has an inclined and curved side surface, and each of the plurality of edge-cut recesses 261 exposes the color filter 250. At a portion where the plurality of edge-cut recesses 261 is not formed, the overcoating layer 260 serves as a planarization layer.

The filling layer 270 is formed on the overcoating layer 260. The filling layer 270 is formed of a material having a higher refractive index than the overcoating layer 260. The filling layer 270 may have a refractive index of about 1.7 to about 2.0. To be specific, the filling layer 270 may be a layer in which nanoparticles each having a size of several tens of nm and formed of titanium oxide ($TiO_2$) or zirconium oxide ($ZrO_2$) having a higher refractive index than a polymer binder are dispersed in the polymer binder. Or a layer in which nanoparticles formed of titanium oxide ($TiO_2$) or zirconium oxide ($ZrO_2$) having a higher refractive index than photoresist are dispersed in the photoresist.

The filling layer 270 is configured to fill at least a part of the inside of the edge-cut recess 261 of the overcoating layer 260. When the filling layer 270 fills at least apart of the inside of the edge-cut recess 261, the filling layer 270 may fill only a part of the inside of the edge-cut recess 261 as illustrated in FIG. 2B or the filling layer 270 may fill the entire inside of the edge-cut recess 261. As illustrated in FIG. 2B, if the filling layer 270 fills only a part of the inside of the edge-cut recess 261, the filling layer 270 fills only a partial space of the edge-cut recess 261 from the bottom of the edge-cut recess 261, so that the filling layer 270 is formed to have an embossed structure.

In the organic light emitting display device 200 according to an exemplary embodiment of the present disclosure, the overcoating layer 260 includes the plurality of edge-cut recesses 261, and the plurality of edge-cut recesses 261 exposes the color filter 250. Therefore, in the filling layer 270 formed on the overcoating layer 260, a portion of filling the plurality of edge-cut recesses 261 of the overcoating layer 260 is in contact with the overcoating layer 260 or in contact with the color filter 250. If the light emitted from an organic light emitting layer 242 travels along a contact surface between the filling layer 270 and the overcoating layer 260, the light emitted from the organic light emitting layer 242 travels in the same manner as the light traveling at the interface between the overcoating layer 160A and the buffer layer for reducing step difference 170A described in FIG. 1A and FIG. 1B. Meanwhile, if the light emitted from the organic light emitting layer 242 travels along a contact surface between the filling layer 270 and the color filter 250, since the filling layer 270 has a higher refractive index than the color filter 250, the light emitted from the light emitting layer 242 may be total-reflected at the contact surface between the filling layer 270 and the color filter 250. Therefore, the light total-reflected at the contact surface between the filling layer 270 and the color filter 250 and traveling toward a cathode 243 is reflected at the cathode 243 and then travels toward the filling layer 270. Thus, the light can be reused, and since the light emitted from the organic light emitting layer 242 passes through an MLA including the filling layer 270 and the overcoating layer 260 again, it can be converted into a light traveling at an incident angle lower than a total reflection critical angle at an interface between the substrate 210 and air. Therefore, it is possible to improve light extraction efficiency of substrate mode lights confined within the organic light emitting display device 200.

Although FIG. 2A and FIG. 2D illustrate that the filing layer 270 is formed so as to have an embossed structure, the filling layer 270 may fill the entire inside of the plurality of edge-cut recesses 261 and planarize an upper portion of the overcoating layer 260.

Figure 3:
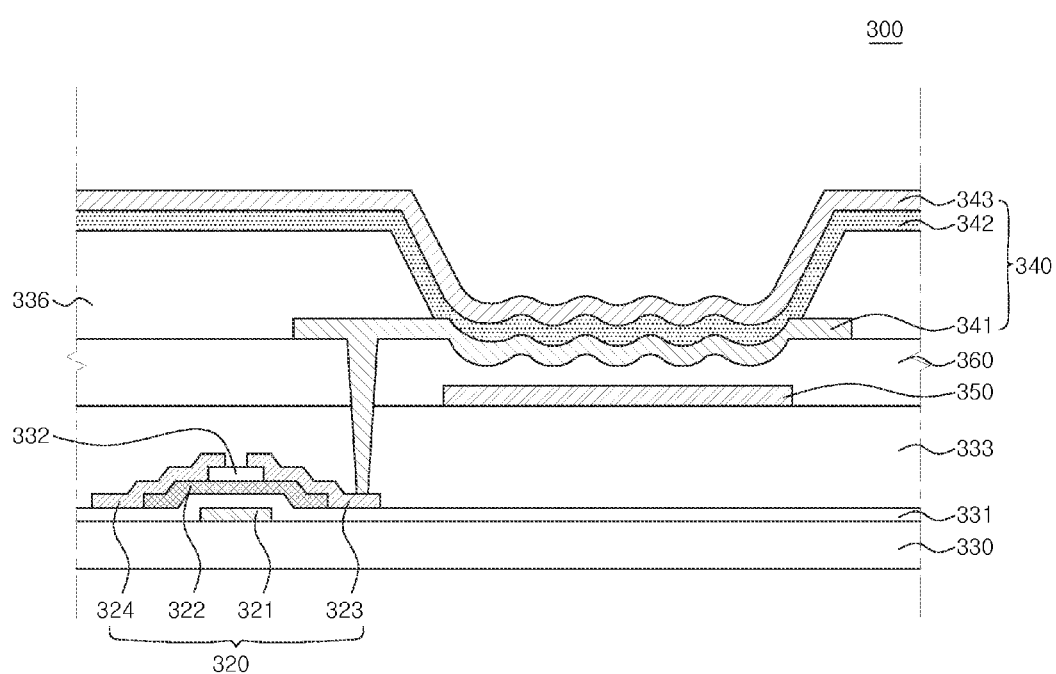
FIG. 3 is a cross-sectional view provided to describe an organic light emitting display device that does not include a buffer layer for reducing the step difference according to an exemplary embodiment.

FIG. 3 is a cross-sectional view provided to describe an organic light emitting display device that does not include a buffer layer for reducing step difference according to an exemplary embodiment. Referring to FIG. 3, an organic light emitting display device 300 includes a substrate 310, a thin film transistor 320, a color filter 350, an overcoating layer 360, and organic light emitting element 340. The organic light emitting display device 300 illustrated in FIG. 3 is substantially the same as the organic light emitting display device 100A illustrated in FIG. 1A and FIG. 1B except that a buffer layer for reducing step difference is omitted. Therefore, redundant description thereof will be omitted.

Referring to FIG. 3, since a plurality of recesses of the overcoating layer 360 has a gentle morphology, the organic light emitting element 340 including an anode 341, an organic light emitting layer 342, and a cathode 343 and a bank 336 may be formed on the overcoating layer 360 without a buffer layer for reducing step difference between the overcoating layer 360 and the anode 341 as illustrated in FIG. 1A.

Herein, moisture generated by outgassing from the overcoating layer 360 may be directly diffused to the organic light emitting element 340, which may deteriorate the organic light emitting element 340. In order to suppress such deterioration, a second passivation layer (not illustrated) may be additionally deposited on the overcoating layer 360 to thickness of several tens to several hundreds of nm. Preferably, the second passivation layer may have a refractive index equivalent or similar to a refractive index of the overcoating layer 360 or the anode 341. For example, a refractive index of the second passivation layer may be closer to a refractive index of the anode 341 than a refractive index of the overcoating layer 360. The second passivation layer (not illustrated) needs to be formed of an inorganic insulation material, for example, silicon nitride. If the second passivation layer (not illustrated) is disposed on the overcoating layer 360 by deposition, the second passivation layer (not illustrated) is formed to have a shape resembling a morphology of the overcoating layer 360.

That is, an edge of each of the plurality of recesses of the overcoating layer 360 is formed so as not to be peaky, so that a surface on which the organic light emitting element 340 is disposed may have a gradual curvature. The organic light emitting element 340 and the bank 336 may be directly formed on the overcoating layer 360 without a buffer layer for reducing step difference between the overcoating layer 360 and the anode 341. Or instead of a buffer layer for reducing step differences, the second passivation layer (not illustrated) may be interposed between the overcoating layer 360 and the anode 341. The organic light emitting element 340 and the bank 336 may be formed on the second passivation layer (not illustrated).

Thus, in the organic light emitting display device 300 according to an exemplary embodiment of the present disclosure, the surface on which the organic light emitting element 340 is disposed may be a top surface of the overcoating layer 360 in which a recess 361 of the overcoating layer 360 has a gentle morphology. Otherwise, the organic light emitting display device 300, the surface on which the organic light emitting element 340 is disposed may be a top surface of the second passivation layer (not illustrated) having a shape resembling the morphology of the recess 361 of the overcoating layer 360. Herein, the overcoating layer 360 or the second passivation layer (not illustrated) has a non-flat surface having a gentle slope. Thus, the organic light emitting element 340 is formed on the non-flat surface having a gentle slope.

If an aspect ratio of the recess of the overcoating layer is 1 or more, a peaky edge has a steep slope like the first connection part connecting the adjacent recesses as illustrated in FIG. 1B. In the case of an organic light emitting display device including such an overcoating layer sharply changed in morphology, even if a buffer layer for reducing step difference is formed on the overcoating layer, an organic light emitting layer may not be continuously formed at a first connection part of a recess of the overcoating layer but may be disconnected. Therefore, there may be a partial short between an anode and a cathode. Or even if there is no short between the anode and the cathode, the cathode may also not be continuously formed at the first connection part of the recess of the overcoating layer but may be disconnected.

That is, since an edge of each recess of the overcoating layer is peaky, the organic light emitting layer and/or the cathode formed on the recess of the overcoating layer may be partially disconnected. Therefore, there may be a short between the anode and the cathode of the organic light emitting element or the cathode may not have a smooth conduction state. At a point where the organic light emitting layer and/or the cathode formed on the recess of the overcoating layer is partially disconnected, the organic light emitting element cannot emit light. Thus, luminous efficiency of the organic light emitting element is finally decreased.

In order to solve the problem caused by a shape of a recess of an overcoating layer, in the organic light emitting display device 100A according to an exemplary embodiment of the present disclosure, the buffer layer for reducing step difference 170A configured to compensate an aspect ratio of the recess 161A of the overcoating layer 160A may be formed on the recess 161A of the overcoating layer 160A. Or the overcoating layer 360 including the recess in which a step-compensation is not needed may be formed.

In the latter case, the organic light emitting element 340 including the anode 341, the organic light emitting layer 342, and the cathode 343 and the bank 336 may be formed on the overcoating layer 360 without a buffer layer for reducing step difference interposed therebetween. That is, if an edge of the recess 361 of the overcoating layer 360 is not peaky but gentle, the organic light emitting element 340 including the anode 341, the organic light emitting layer 342, and the cathode 343 and the bank 336 may be formed without a buffer layer for reducing step difference.

In order to do so, the peaky edge of the overcoating layer 360 needs to have a gentler slope. That is, the morphology of the recess of the overcoating layer 360 needs to be gentler.

A shape of the recess of the overcoating layer 360 is formed by photolithography or the like, and by controlling a thermal process performed in this case, the morphology of the recess of the overcoating layer 360 can be controlled.

To be specific, in order to form the recess of the overcoating layer 360, photoresist is coated and patterned into a recessed shape by photolithography, and a thermal process is performed thereto. In this case, the thermal process is not performed at a time, but needs to be gradually performed through two steps in order to form a shape of the recess of the overcoating layer 360. For example, before a final thermal process is performed at about 200° C. or more to about 250° C. or less, an intermediate thermal process needs to be performed at about 100° C. or more to about 130° C. or less.

Herein, a time for performing the intermediate thermal process is involved in the morphology of the recess of the overcoating layer 360. As a time for performing the intermediate thermal process is increased, the final morphology of the recess of the overcoating layer 360 is increased. As an extreme case, if the final thermal process is directly performed without requiring a time for performing the intermediate thermal process, the overcoating layer 360 is planarized without the morphology of the recess of the overcoating layer 360.

By using such a tendency, various organic light emitting display devices each having a different morphology of the recess of an overcoating layer 360 were manufactured. With these organic light emitting display devices, the inventors of the present disclosure conducted an experiment to find a morphology of the recess of the overcoating layer 360, i.e., an aspect ratio of the recess of the overcoating layer 360, for the maximum luminous efficiency of the organic light emitting element 340. Hereinafter, a result of the experiment will be described with reference to FIG. 6.

Figure 6:
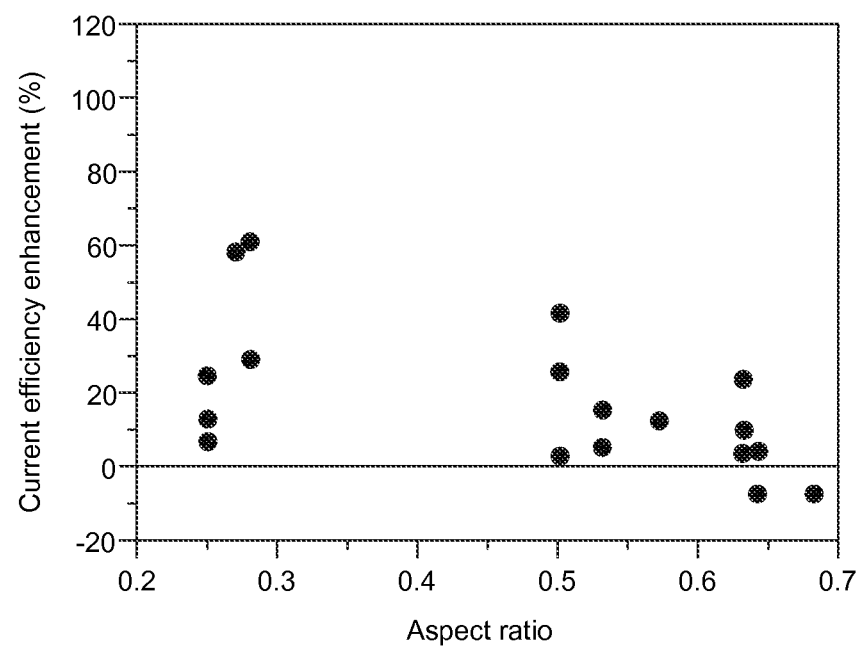
FIG. 6 is a graph showing current efficiency enhancement of an organic light emitting display device depending on an aspect ratio of an overcoating layer having a plurality of recesses according to an exemplary embodiment of the present disclosure.

FIG. 6 is a graph showing a relationship between an aspect ratio of the recess of the overcoating layer 360 and a different current efficiency enhancement (%) of each organic light emitting display device. Herein, a higher current efficiency enhancement means a higher luminous efficiency.

It can be seen that in case the aspect ratio of the recess of the overcoating layer 360 is about 0.25 or more to about 0.6 or less, the current efficiency enhancement is higher, as compared with a case where the aspect ratio of the recess of the overcoating layer 360 is more than 0.6. It can be seen that in case the aspect ratio of the recess of the overcoating layer 360 is more than 0.6, the current efficiency enhancement tends to decrease.

According to the tendency as shown in FIG. 6, it can be seen that in case the aspect ratio of the recess of the overcoating layer 360 is about 0.3 or more to about 0.5 or less, the current efficiency enhancement has the maximum value.

Thus, in the organic light emitting display device 300 according to an exemplary embodiment of the present disclosure, the surface on which the organic light emitting element is disposed may be the top surface of the overcoating layer 360 in which the recess of the overcoating layer 360 has an aspect ratio of about 0.25 or more to about 0.6 or less. Otherwise, in the organic light emitting display device 300 according to an exemplary embodiment of the present disclosure, the surface on which the organic light emitting element 340 is disposed may be the top surface of the second passivation layer (not illustrated) resembling the morphology of the overcoating layer 360 in which the recess of the overcoating layer 360 has an aspect ratio of about 0.25 or more to about 0.6 or less. That is, the overcoating layer 360 or the second passivation layer (not illustrated) has a non-flat surface having an aspect ratio of about 0.25 or more to about 0.6 or less, and. Thus, the organic light emitting element 340 is formed on the non-flat surface having an aspect ratio of about 0.25 or more to about 0.6 or less, and each of the anode 341, the organic light emitting layer 342, and the cathode 343 has a shape resembling a morphology of the non-flat surface.

In conclusion, in case the recess of the overcoating layer 360 is formed, the intermediate thermal process is performed necessarily for a somewhat short time, so that a first connection part of the recess of the overcoating layer 360 may be formed so as to have a gentle slope. If the overcoating layer 360 is formed such that the recess of the overcoating layer 360 has an aspect ratio of about 0.25 or more to about 0.6 or less according to this method, the organic light emitting element 340 including the anode 341, the organic light emitting layer 342, and the cathode 343 and the bank 336 can be formed on the overcoating 360 without a buffer layer for reducing step difference interposed therebetween. Herein, although not illustrated, as described above, the second insulating passivation layer (not illustrated) having a shape resembling the morphology of the recess of the overcoating layer 360 and a refractive index similar to that of the anode 341 while preventing diffusion of outgassing from the overcoating layer 360 to the organic light emitting element 340 may be additionally formed between the overcoating layer 360 and the anode 341.

Figure 4:
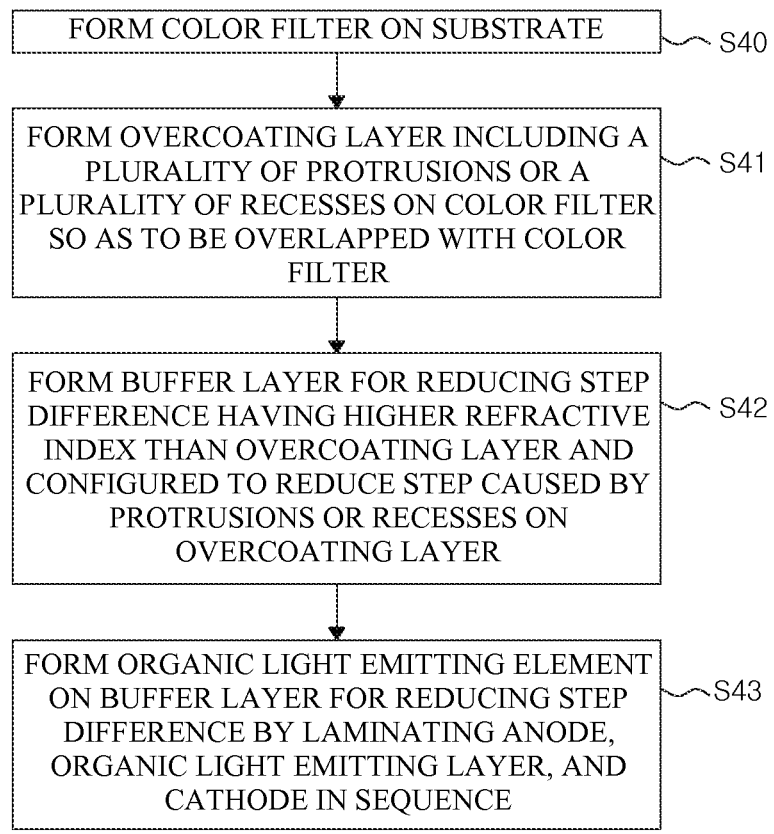
FIG. 4 is a flowchart provided to describe a method for manufacturing an organic light emitting display device including an overcoating layer having a plurality of recesses and a buffer layer for reducing a step difference according to an exemplary embodiment of the present disclosure.
Figure 5A:
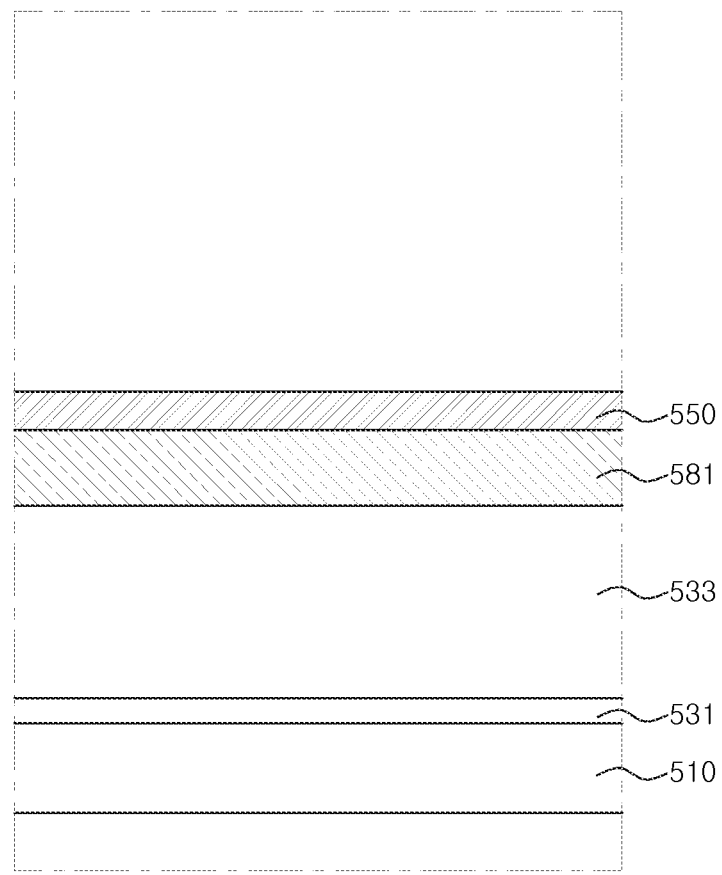
FIG. 5A to FIG. 5F are process cross-sectional views provided to describe an organic light emitting display device including an overcoating layer having a plurality of recesses and a buffer layer for reducing a step difference according to an exemplary embodiment of the present disclosure.
Figure 5B:
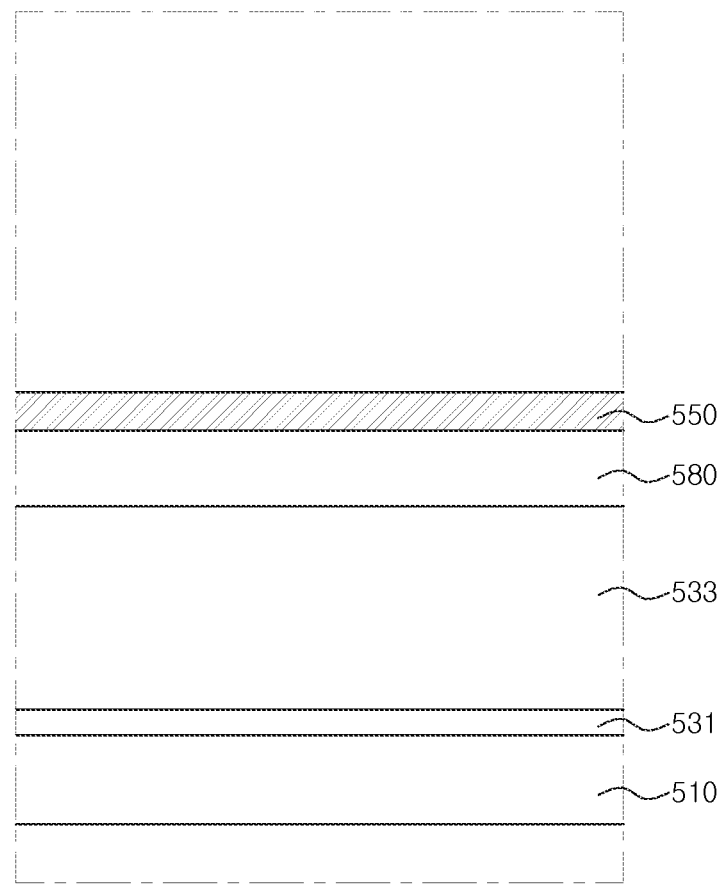

FIG. 4 is a flowchart provided to describe a method for manufacturing an organic light emitting display device including an overcoating layer having a plurality of recesses and a buffer layer for reducing step difference according to an exemplary embodiment of the present disclosure. FIG. 5A to FIG. 5F are process cross-sectional views provided to describe an organic light emitting display device including an overcoating layer having a plurality of recesses and a buffer layer for reducing step difference according to an exemplary embodiment of the present disclosure. FIG. 5A to FIG. 5F do not illustrate a part corresponding to a thin film transistor among various elements of an organic light emitting display device 500, but mainly illustrate a part overlapped with a part where a color filter 550 of the organic light emitting display device 500 is formed. Further, the organic light emitting display device 500 illustrated in FIG. 5F is substantially the same as the organic light emitting display device 100A illustrated in FIG. 1B.

Firstly, the color filter 550 is formed on a substrate 510 (S40). Formation of the color filter 550 on the substrate 510 will be described in more detail with reference to FIG. 5C.

Figure 5C:
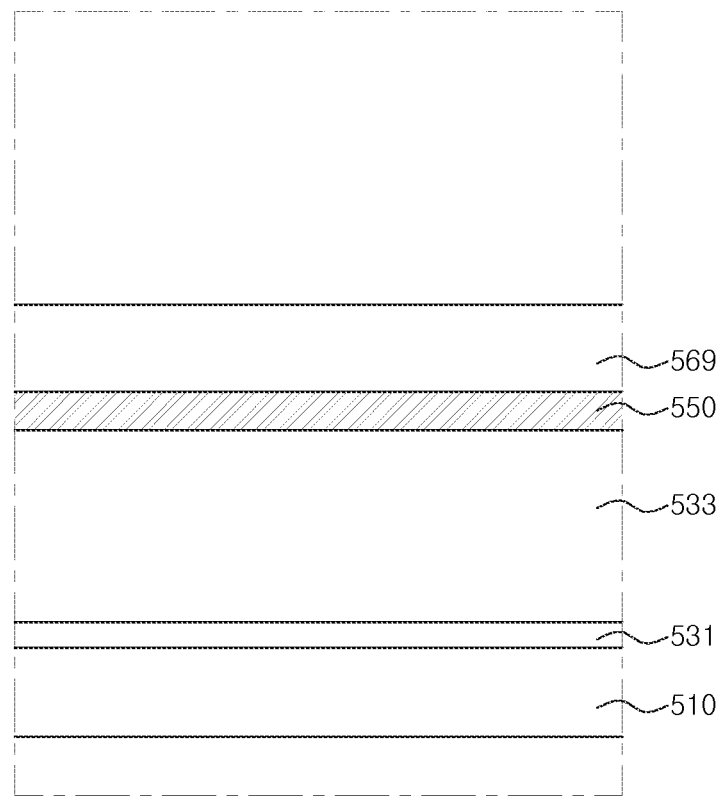

Referring to FIG. 5C, the color filter 550 is formed on the substrate 510. To be more specific, the color filter 550 is formed on a passivation layer 533 on the substrate 510.

In some exemplary embodiments, an air gap 580 may be formed between the substrate 510 and the color filter 550. Formation of the air gap 580 will be described in more detail with reference to FIG. 5A and FIG. 5B.

Referring to FIG. 5A, before the color filter 550 is formed on the substrate 510 in order to form the air gap 580, a sacrificial layer 581 to be pyrolyzed may be formed between the substrate 510 and the color filter 550. To be specific, the sacrificial layer 581 is formed between the passivation layer 533 and the color filter 550. The sacrificial layer 581 is formed of a material to be decomposed during a thermal process, and may be formed of various materials to be removed by pyrolysis.

Referring to FIG. 5A and FIG. 5B, after the sacrificial layer 581 is formed, the color filter 550 may be formed on the sacrificial layer 581, and after the color filter 550 is formed, the sacrificial layer 581 may be decomposed by performing a thermal process to the sacrificial layer 581. As such, the air gap 580 may be formed between the substrate 510 and the color filter 550.

Then, an overcoating layer 560 including a plurality of recesses 561 overlapped with the color filter 550 is formed on the color filter 550 (S41). Formation of the overcoating layer 560 including the plurality of recesses 561 will be described in more detail with reference to FIG. 5C and FIG. 5D.

Figure 5D:
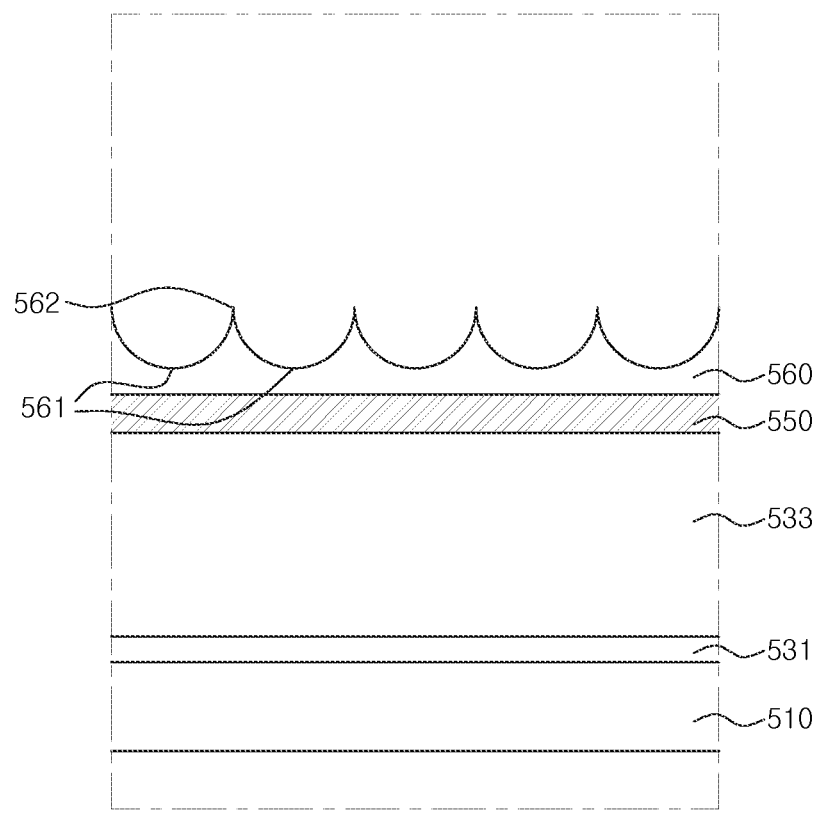

Referring to FIG. 5C, in order to form the overcoating layer 560, a photoresist material 569 is coated on the color filter 550. Both of a negative photoresist and a positive photoresist may be used, but in order to form the recesses 561 in the overcoating layer 560, the negative photoresist may be advantageous for a manufacturing process. By performing a photolithography process to the overcoating layer 560, the plurality of recesses 561 of the overcoating layer 560 is formed as illustrated in FIG. 5D. The plurality of recesses 561 may be formed only in the overcoating layer 560 overlapped with the color filter 550.

In some exemplary embodiments, during the above-described a photolithography process, the overcoating layer 560 may be formed so as to have the same shape as the overcoating layer 260 illustrated in FIG. 2A by controlling an exposure amount or the like. For example, by increasing an exposure amount, an amount of the photoresist material 569 to be patterned and removed may be increased. Thus, the overcoating layer 560 may be formed so as to have the plurality of edge-cut recesses 261 as illustrated in FIG. 2A.

Herein, in order to form the recess 561 of the overcoating layer 560, photoresist is coated and patterned into a recessed shape by photolithography, and a thermal process is performed thereto. In this case, the thermal process is not performed at a time, but needs to be gradually performed through two steps in order to form a shape of the recess 561 of the overcoating layer 560. For example, before a final thermal process is performed at about 200° C. or more to about 250° C. or less, an intermediate thermal process needs to be performed at about 100° C. or more to about 130° C. or less. By controlling a temperature and a time for the intermediate thermal process, an aspect ratio of the recess 561 of the overcoating layer 560 may be controlled. The recess 561 of the overcoating layer 560 may have an aspect ratio of 0.25 or more to 0.6 or less by not only the method of controlling a temperature and a time for the intermediate thermal process, which is just one example, but also a method of controlling an UV exposure amount during a patterning process in the photolithography process, but the present disclosure is not limited thereto.

For convenience in explanation, FIG. 5C and FIG. 5D illustrate that the overcoating layer 560 is formed of photoresist, but is not limited thereto. The overcoating layer 560 may be formed of various insulation materials having a refractive index of about 1.5, and the plurality of recesses 561 of the overcoating layer 560 may be formed by a photolithography process to the various insulation materials.

Although FIG. 5C and FIG. 5D illustrate that the plurality of recesses 561 is formed in the overcoating layer 560, the plurality of protrusions 263 may be formed in the overcoating layer 560 as illustrated in FIG. 2A and FIG. 2B. In order to form the plurality of protrusions 263 in the overcoating layer 560, the photoresist material 569 is coated on the color filter 550 as illustrated in FIG. 5C and a photolithography process may be performed thereto.

In some exemplary embodiments, before the color filter 550 is formed, an insulation layer having a lower refractive index than the overcoating layer 560 and the color filter 550 may be formed between the substrate 510 and the color filter 550. The insulation layer may be formed at the same position as the air gap 580 illustrated in FIG. 5B.

Then, a buffer layer for reducing step difference 570 having a higher refractive index than the overcoating layer 560 and configured to reduce a step caused by the recesses 561 is formed on the overcoating layer 560 (S42). Formation of the buffer layer 570 will be described in more detail with reference to FIG. 5E.

Figure 5E:
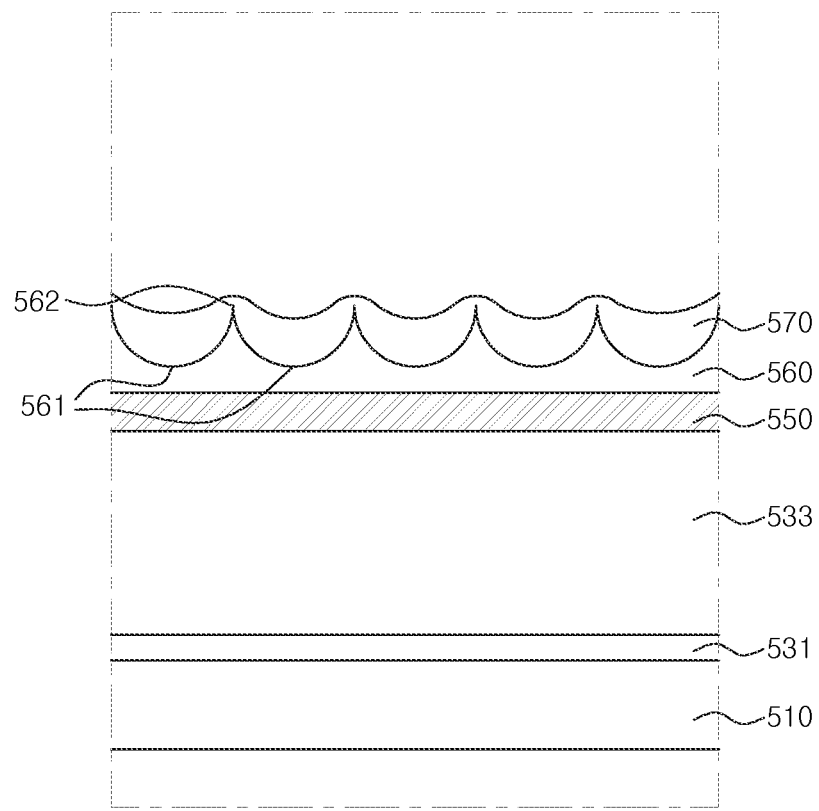
Figure 5F:
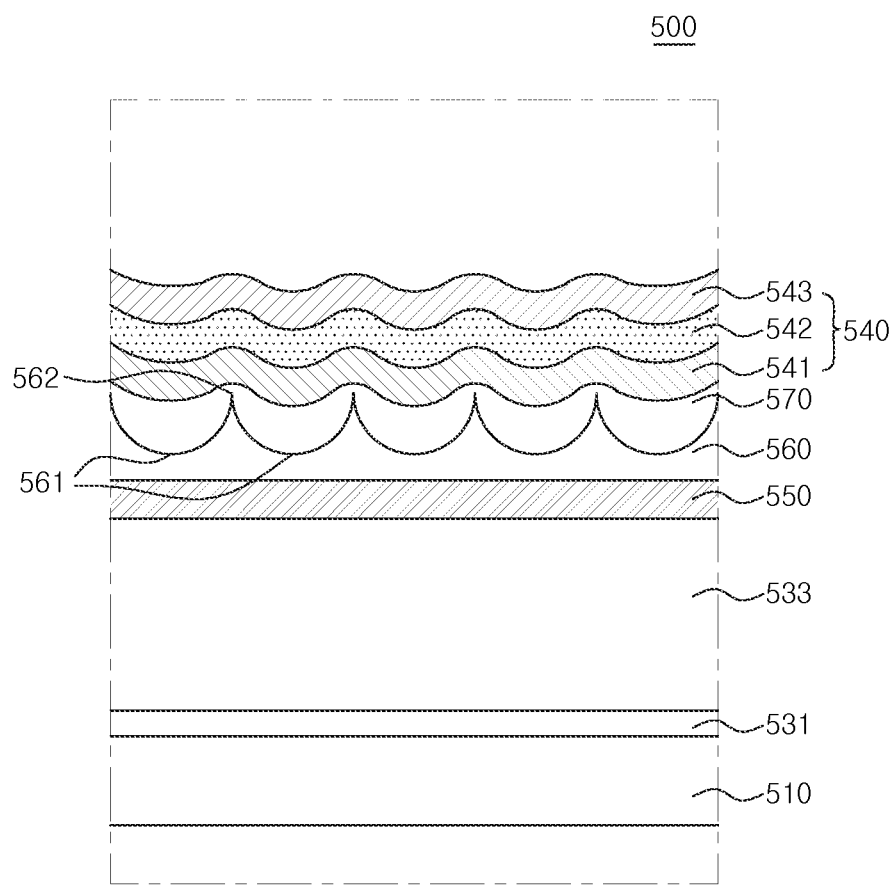

Referring to FIG. 5E, a spin-coating method may be used to form the buffer layer for reducing step difference 570. That is, formation of the buffer layer 570 includes spin-coating of a polymer binder or photoresist in which nano-particles are dispersed. During the spin coating, a speed of the spin-coating and a viscosity of the polymer binder or photoresist may be controlled in order to control thickness and a degree of non-flatness of the buffer layer 570. For example, if a spin-coating speed is high and a viscosity of the polymer binder or photoresist is low, the buffer layer 570 formed on the recess 561 may have smaller thickness and a higher degree of non-flatness, as compared with a case where a spin-coating speed is low and a viscosity of the polymer binder or photoresist is high. In the method for manufacturing an organic light emitting display device according to an exemplary embodiment of the present disclosure, the spin-coating speed and the viscosity of the polymer binder or photoresist may be controlled such that the buffer layer 570 formed on the recess 561 of the overcoating layer 560 has greater thickness than the buffer layer 570 formed on a first connection part 562 of the overcoating layer 560.

Although not illustrated in FIG. 5E, even if the overcoating layer 560 includes a plurality of protrusions as illustrated in FIG. 2A, the spin-coating speed and the viscosity of the polymer binder or photoresist may be controlled. It may be controlled such that the buffer layer for reducing step difference 570 formed on the protrusion of the overcoating layer 560 has smaller thickness than the buffer layer 570 formed on a second connection part of the overcoating layer 560.

FIG. 5E illustrates that the spin-coating method is used to form the buffer layer for reducing step difference 570, various wet coating methods such as photolithography, slit coating, ink jet printing, dip coating, nozzle printing, screen printing, etc. may be used.

Then, an organic light emitting element 540 is formed on the buffer layer for reducing step difference 570 by laminating an anode 541, an organic light emitting layer 542, and a cathode 543 in sequence (S43). Formation of the organic light emitting element 540 will be described in more detail with reference to FIG. 5E.

Referring to FIG. 5E, the anode 541 is formed so as to resemble a shape of the buffer layer for reducing step difference 570. The organic light emitting layer 542 is formed on the anode 541 so as to resemble a shape of the anode 541, and the cathode 543 is formed on the organic light emitting layer 542 so as to resemble a shape of the organic light emitting layer 542.

In some exemplary embodiments, if the recess 561 of the overcoating layer 560 is formed so as to have an aspect ratio of 0.25 or more to 0.6 or less, the anode 541 is formed on the overcoating layer 560 so as to resemble a gentle morphology of the recess 561 of the overcoating layer 560. The organic light emitting layer 542 is formed on the anode 541 so as to resemble a shape of the anode 541, and the cathode 543 is formed on the organic light emitting layer 542 so as to resemble a shape of the organic light emitting layer 542 without performing the step S42 of forming the buffer layer for reducing step difference 570. That is, like the organic light emitting layer 300 illustrated in FIG. 3, the anode 541 may be directly formed on the overcoating layer 560 without forming a buffer layer for reducing step difference. In this case, before the anode 541 is formed, a second passivation layer (not illustrated) having a refractive index equivalent or similar to a refractive index of the anode 541 and thickness of several tens to several hundreds of nm may be formed on the overcoating layer 560. If the second passivation layer (not illustrated) is disposed on the overcoating layer 560 by deposition, the second passivation layer (not illustrated) is formed to have a shape resembling a gentle morphology of the recess 561 the overcoating layer 560.

Since the overcoating layer and the buffer layer for reducing step difference of the present disclosure are used, the organic light emitting display device according to an exemplary embodiment of the present disclosure obtains equivalent or higher light extraction efficiency. Thus, the organic light emitting display device has a low driving voltage, excellent current efficiency and power efficiency as compared with Comparative Example 1. More details thereof will be described with reference to Table 1.

TABLE 1

|  | Driving voltage | Cd/A | lm/W |
|---|---|---|---|
| Comparative Example 1 | 12.8 | 66 | 6 |
| Organic light emitting display device according to an exemplary embodiment of the present disclosure | 10.9 | 93 | 7 |

Referring to Table 1, each of Comparative Example 1 and the organic light emitting display device according to an exemplary embodiment of the present disclosure illustrated in FIG. 1A includes white organic light emitting element designed by laminating two organic light emitting layers. One of the two organic light emitting layers is an organic light emitting layer configured to emit blue light, and the other one is an organic light emitting layer configured to emit yellow-green light. These two organic light emitting layers are laminated.

Referring to Table 1, the organic light emitting display device according to an exemplary embodiment of the present disclosure illustrated in FIG. 1A has a structure in which a substrate, an overcoating layer, a buffer layer for reducing step difference, an anode, an organic light emitting layer, and a cathode are laminated from the bottom. Herein, to be specific, the organic light emitting layer has a structure in which a charge injection or transporting layer of 50 nm, an organic light emitting layer of 20 nm configured to emit yellow-green light, a charge injection or transporting layer of 90 nm, an organic light emitting layer of 20 nm configured to emit blue light, and a charge injection or transporting layer of 180 nm are laminated from the bottom. Herein, the overcoating layer and the buffer layer for reducing step difference respectively refer to the overcoating layer and the buffer layer for reducing step difference of the present disclosure. Herein, the charge injection or transporting layers may include a hole injection layer, a hole transporting layer, a charge generation layer, an electron injection layer, an electron transporting layer, etc.

Referring to Table 1, Comparative Example 1 uses an organic light emitting layer having the same structure of 360 nm in the same manner as the organic light emitting display device according to an exemplary embodiment of the present disclosure illustrated in FIG. 1A except that the overcoating layer and the buffer layer for reducing step differences of the present disclosure are not used. In other words, the organic light emitting display device according to an exemplary embodiment of the present disclosure illustrated in FIG. 1A is different from Comparative Example 1 in that the overcoating layer and the buffer layer for reducing step difference of the present disclosure are used.

Referring to Table 1, although the organic light emitting layers having the same thickness are respectively used in Comparative Example 1 and the organic light emitting display device according to an exemplary embodiment of the present disclosure, a driving voltage V of the organic light emitting display device according to an exemplary embodiment of the present disclosure is lower by 1.9 V than a driving voltage of Comparative Example 1. Accordingly, current efficiency (cd/A) and power efficiency (lm/W) of the organic light emitting display device according to an exemplary embodiment of the present disclosure are respectively increased by 40% and 65% than current efficiency and power efficiency of Comparative Example 1.

Since the overcoating layer and the buffer layer for reducing step difference of the present disclosure are used, the organic light emitting display device according to an exemplary embodiment of the present disclosure illustrated in FIG. 1A obtains equivalent or higher light extraction efficiency. It also includes the organic light emitting layer with smaller thickness as compared with Comparative Example 1. More details thereof will be described with reference to Table 2.

TABLE 2

|  | Driving voltage | Cd/A | lm/W |
|---|---|---|---|
| Comparative Example 1 | 12.8 | 66 | 16 |
| Organic light emitting display device according to an exemplary embodiment of the present disclosure | 7.8 | 97 | 39 |

Referring to Table 2, each of Comparative Example 1 and the organic light emitting display device according to an exemplary embodiment of the present disclosure is white organic light emitting element designed by laminating two organic light emitting layers. One of the two organic light emitting layers is an organic light emitting layer configured to emit blue light, and the other one is an organic light emitting layer configured to emit yellow-green light. These two organic light emitting layers are laminated.

Referring to Table 2, the organic light emitting display device according to an exemplary embodiment of the present disclosure has a structure in which a substrate, an overcoating layer, a buffer layer for reducing step difference, an anode, an organic light emitting layer, and a cathode are laminated from the bottom. Herein, to be specific, the organic light emitting layer has a structure in which a charge injection or transporting layer of 50 nm, an organic light emitting layer of 20 nm configured to emit yellow-green light, a charge injection or transporting layer of 70 nm, an organic light emitting layer of 20 nm configured to emit blue light, and a charge injection or transporting layer of 70 nm are laminated from the bottom. Herein, the overcoating layer and the buffer layer for reducing step difference respectively refer to the overcoating layer and the buffer layer for reducing step difference of the present disclosure. Herein, the charge injection or transporting layers may include a hole injection layer, a hole transporting layer, a charge generation layer, an electron injection layer, an electron transporting layer, and etc.

Referring to Table 2, in the organic light emitting display device according to an exemplary embodiment of the present disclosure, each of the organic light emitting layer configured to emit blue light, the organic light emitting layer configured to emit yellow-green light, and the charge injection or transporting layers, has a thickness of smaller than 100 nm. In other words, in the organic light emitting display device according to an exemplary embodiment of the present disclosure, each layer constituting the organic light emitting layer has a thickness of smaller than 100 nm.

Referring to Table 2, Comparative Example 1 does not use the overcoating layer and the buffer layer for reducing step difference of the present disclosure and includes charge injection or transporting layers having smaller thickness than the charge injection or transporting layers in the organic light emitting display device according to an exemplary embodiment of the present disclosure. Except this matter, Comparative Example 1 and the organic light emitting display device according to an exemplary embodiment of the present disclosure have the same structure.

Referring to Table 2, the thickness of the organic light emitting layer in the organic light emitting display device according to an exemplary embodiment of the present disclosure is smaller by about 36% than the thickness of the organic light emitting layer in Comparative Example 1. A driving voltage (V) of the organic light emitting display device according to an exemplary embodiment of the present disclosure is lower by 5 V than a driving voltage of Comparative Example 1. Accordingly, current efficiency and power efficiency of the organic light emitting display device according to an exemplary embodiment of the present disclosure are respectively increased by 47% and 140% than current efficiency and power efficiency of Comparative Example 1.

That is, since the overcoating layer and the buffer layer for reducing step difference of the present disclosure are used, it is possible to remarkably reduce thickness of the organic light emitting layer and also possible to improve light extraction efficiency. Accordingly, it is possible to obtain higher effects in terms of reduction in a driving voltage and power consumption, and current efficiency and power efficiency.

Hereinafter, various features of the organic light emitting display device including the overcoating layer having the plurality of recesses and the buffer layer for reducing step difference according to an exemplary embodiment of the present disclosure will be described.

According to another feature of the present disclosure, a top surface of the buffer layer has a more gradual curvature than the plurality of protrusions or the plurality of recesses.

According to yet another feature of the present disclosure, the overcoating layer includes a first connection part configured to connect the recesses or a second connection part configured to connect the protrusions.

According to still another feature of the present disclosure, in case the overcoating layer includes the first connection part, the buffer layer disposed on the recess has greater thickness than the buffer layer disposed on the first connection part. Further, in case the overcoating layer includes the second connection part, the buffer layer disposed on the protrusion has smaller thickness than the buffer layer disposed on the second connection part.

According to still another feature of the present disclosure, the anode, the organic light emitting layer, and the cathode have top and bottom surfaces having recesses and protrusions resembling a shape of the buffer layer.

According to still another feature of the present disclosure, assuming that a radius of protrusion or recess is $R1$, a radius of its adjacent protrusion or recess is $R2$, and a distance between the centers of the adjacent protrusions or recesses is S, the sum of $R1$ and $R2$ is equal to or greater than S.

According to still another feature of the present disclosure, the organic light emitting layer includes a blue organic light emitting layer and emits white light.

According to still another feature of the present disclosure, the buffer layer is a layer in which nanoparticles having a higher refractive index than a polymer binder or photoresist are dispersed in the polymer binder or the photoresist.

According to still another feature of the present disclosure, the organic light emitting display device further includes: an insulation layer disposed between the substrate and the color filter and having a lower refractive index than the overcoating layer and the color filter.

According to still another feature of the present disclosure, the organic light emitting display device further includes: an air gap disposed between the substrate and the color filter.

Hereinafter, various features of the organic light emitting display device including the overcoating layer having the plurality of edge-cut recesses and the filling layer according to an exemplary embodiment of the present disclosure will be described.

According to another feature of the present disclosure, the filling layer is configured to planarize an upper portion of the overcoating layer.

According to yet another feature of the present disclosure, the filling layer fills only a partial space of the recess from the bottom of the recess, so that the filling layer is disposed to have an embossed structure.

Hereinafter, various features of the method for manufacturing the organic light emitting display device including the overcoating layer having the plurality of edge-cut recesses and the buffer layer for reducing step difference according to an exemplary embodiment of the present disclosure will be described.

According to another feature of the present disclosure, the forming the overcoating layer includes coating a photoresist material on the color filter and forming the plurality of protrusions or the plurality of recesses of the overcoating layer by a photolithography process.

According to yet another feature of the present disclosure, the forming a buffer layer includes spin-coating a polymer binder or photoresist in which nanoparticles are dispersed.

According to still another feature of the present disclosure, the spin-coating includes controlling thickness of the buffer layer by controlling a spin-coating speed and a viscosity of the polymer binder or photoresist.

According to still another feature of the present disclosure, the method for manufacturing the organic light emitting display device further includes: forming a sacrificial layer to be pyrolyzed between the substrate and the color filter; and forming an air gap between the substrate and the color filter by performing a thermal process to the sacrificial layer.

Hereinafter, various features of the organic light emitting display device including the organic light emitting element having a shape resembling a morphology of a non-flat surface according to an exemplary embodiment of the present disclosure will be described.

According to another feature of the present disclosure, the organic light emitting display device further includes: a second passivation layer disposed between the overcoating layer and the organic light emitting layer. The second passivation layer is formed of an inorganic insulation material and has a refractive index closer to a refractive index of the anode than a refractive index of the overcoating layer. Further, the second passivation layer has a shape resembling the morphology of the non-flat surface of the overcoating layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
a substrate;
a color filter;
an overcoating layer disposed on the color filter and includes a plurality of protrusions or a plurality of recesses overlapped with the color filter;
a buffer layer for reducing a step difference on the overcoating layer and having a higher refractive index than the overcoating layer and configured to reduce the step difference by the plurality of protrusions or the plurality of recesses; and
an organic light emitting element on the buffer layer and including an anode, an organic light emitting layer on the anode, and a cathode on the organic light emitting layer.

2. The organic light emitting display device according to claim 1, wherein a top surface of the buffer layer has a more gradual curvature than the plurality of protrusions or the plurality of recesses.

3. The organic light emitting display device according to claim 2, wherein the overcoating layer includes a first connection part configured to connect the recesses or a second connection part configured to connect the protrusions.

4. The organic light emitting display device according to claim 3, wherein in case the overcoating layer includes the first connection part, the buffer layer on the recess has greater thickness than the buffer layer on the first connection part, and in case the overcoating layer includes the second connection part, the buffer layer on the protrusion has smaller thickness than the buffer layer on the second connection part.

5. The organic light emitting display device according to claim 2, wherein the anode, the organic light emitting layer, and the cathode have top and bottom surfaces having recesses and protrusions resembling a shape of the buffer layer.

6. The organic light emitting display device according to claim 1, wherein assuming that a radius of protrusion or recess is R1, a radius of its adjacent protrusion or recess is R2, and a distance between the centers of the adjacent protrusions or recesses is S, then the sum of R1 and R2 is equal to or greater than S.

7. The organic light emitting display device according to claim 1, wherein the organic light emitting layer includes a blue organic light emitting layer and emits white light.

8. The organic light emitting display device according to claim 1, wherein the buffer layer is a layer in which nanoparticles having a higher refractive index than a polymer binder or photoresist are dispersed in the polymer binder or the photoresist.

9. The organic light emitting display device according to claim 1, further comprising:
an insulation layer between the substrate and the color filter and having a lower refractive index than the overcoating layer and the color filter.

10. The organic light emitting display device according to claim 1, wherein the substrate and the color filter are configured to have an air gap therebetween.

11. An organic light emitting display device, comprising:
a substrate;
a color filter on the substrate;
an overcoating layer on the color filter and including a plurality of edge-cut recesses on the color filter that are overlapped with the color filter and configured to expose portions of the color filter;
a filling layer on the overcoating layer and having a higher refractive index than the overcoating layer and configured to fill at least a part of the inside of the plurality of edge-cut recesses; and
an organic light emitting element on the filling layer and including an anode, an organic light emitting layer on the anode, and a cathode on the organic light emitting layer,
wherein each of the plurality of edge-cut recesses has an inclined and curved side surface.

12. The organic light emitting display device according to claim 11, wherein the filling layer is configured to planarize an upper portion of the overcoating layer.

13. The organic light emitting display device according to claim 11, wherein the filling layer fills only a partial space of the recess from the bottom of the recess, so that the filling layer is configured to have an embossed structure.

14. A method for manufacturing an organic light emitting display device, comprising:
forming a color filter on a substrate;
forming an overcoating layer including a plurality of protrusions or a plurality of recesses disposed on the color filter to be overlapped with the color filter;
forming a buffer layer for reducing a step difference, which has a higher refractive index than the overcoating layer and reduces the step difference caused by the plurality of protrusions or the plurality of recesses, on the overcoating layer; and
forming an organic light emitting element by laminating an anode, an organic light emitting layer, and a cathode in sequence on the buffer layer.

15. The method for manufacturing an organic light emitting display device according to claim 14, wherein the forming of the overcoating layer includes:
coating a photoresist material on the color filter; and
forming the plurality of protrusions or the plurality of recesses of the overcoating layer by a photolithography process.

16. The method for manufacturing an organic light emitting display device according to claim 14, wherein the forming of the buffer layer includes:
spin-coating a polymer binder or photoresist in which nanoparticles are dispersed.

17. The method for manufacturing an organic light emitting display device according to claim 16, wherein the spin-coating includes:
controlling a thickness of the buffer layer by controlling a spin-coating speed and a viscosity of the polymer binder or photoresist.

18. The method for manufacturing an organic light emitting display device according to claim 14, further comprising:
forming a sacrificial layer to be pyrolyzed between the substrate and the color filter; and
forming an air gap between the substrate and the color filter by performing a thermal process to the sacrificial layer.

19. An organic light emitting display device, comprising:
a substrate;
a color filter on the substrate;
an overcoating layer on the color filter and including a plurality of protrusions or a plurality of recesses arranged to be overlapped with the color filter;
an organic light emitting element on the overcoating layer and including an anode, an organic light emitting layer on the anode, and a cathode on the organic light emitting layer; and
a passivation layer between the overcoating layer and the organic light emitting layer,
wherein the passivation layer is formed of an inorganic insulation material,
the passivation layer has a refractive index closer to a refractive index of the anode than a refractive index of the overcoating layer,
the passivation layer has a shape resembling the morphology of the non-flat surface of the overcoating layer, and
each of the anode, the organic light emitting layer, and the cathode has a shape resembling a morphology of the non-flat surface of the overcoating layer.

* * * * *